(12) United States Patent
Heiman et al.

(10) Patent No.: US 8,045,651 B2
(45) Date of Patent: Oct. 25, 2011

(54) METHOD AND SYSTEM FOR REDUNDANCY-BASED DECODING IN 8-PSK GSM SYSTEMS

(75) Inventors: Arie Heiman, Rannana (IL); Arkady Molev-Shteiman, Bney Barak (IL)

(73) Assignee: Broadcom Corporation, Irvine, CA (US)

( * ) Notice: Subject to any disclaimer, the term of this patent is extended or adjusted under 35 U.S.C. 154(b) by 1397 days.

(21) Appl. No.: 11/484,481

(22) Filed: Jul. 11, 2006

(65) Prior Publication Data

US 2006/0251192 A1 Nov. 9, 2006

Related U.S. Application Data

(63) Continuation-in-part of application No. 11/189,634, filed on Jul. 26, 2005.

(60) Provisional application No. 60/603,148, filed on Aug. 20, 2004.

(51) Int. Cl.
*H04L 27/06* (2006.01)

(52) U.S. Cl. ........ 375/341; 375/260; 375/316; 375/329; 375/340; 375/342; 370/345; 370/347

(58) Field of Classification Search .................. 375/219, 375/220, 242, 260, 295, 306, 341–344, 346–348, 375/355, 232, 350, 353, 359, 249, 262, 267, 375/299, 316, 322, 339, 345

See application file for complete search history.

(56) References Cited

U.S. PATENT DOCUMENTS

| | | | | |
|---|---|---|---|---|
| 5,488,635 A * | 1/1996 | Chennakeshu et al. | ........ | 375/340 |
| 5,852,630 A * | 12/1998 | Langberg et al. | ............. | 375/219 |
| 6,327,315 B1 * | 12/2001 | Piirainen | ....................... | 375/340 |
| 7,684,753 B2 * | 3/2010 | Ionescu et al. | ................... | 455/10 |
| 7,864,902 B1 * | 1/2011 | Jafarkhani et al. | ............. | 375/347 |
| 2003/0187928 A1 * | 10/2003 | MacLeod et al. | ............. | 709/204 |
| 2004/0196921 A1 * | 10/2004 | Matsumoto et al. | .......... | 375/285 |
| 2007/0189374 A1 * | 8/2007 | Comparsi De Castro et al. | ............................ | 375/232 |
| 2008/0253349 A1 * | 10/2008 | Yu | ................................. | 370/345 |

* cited by examiner

*Primary Examiner* — Shuwang Liu
*Assistant Examiner* — Hirdepal Singh
(74) *Attorney, Agent, or Firm* — McAndrews, Held & Malloy, Ltd.

(57) ABSTRACT

Aspects of a method and system for redundancy-based decoding in 8-PSK GSM systems are provided. A burst process may utilize a gradient search equalization operation to process a received 8-PSK modulated symbol sequence. A frame process may generate a redundancy-based decoded output bit sequence based on the burst process results. Iterative steps of the gradient search equalization operation may be utilized to converge to the burst process results. The redundancy-based decoded output bit sequence of the frame process may be fed back to a subsequent burst process. Results from the subsequent burst process may be utilized to generate a subsequent redundancy-based decoded output bit sequence by a subsequent frame process. The fed-back redundancy-based decoded output bit sequence may be combined with results from a Viterbi equalization operation within the subsequent burst process. Symbol-to-bits and bits-to-symbol conversions may be utilized during the burst process and during the subsequent burst process.

21 Claims, 16 Drawing Sheets

METHOD AND SYSTEM FOR REDUNDANCY-BASED DECODING IN 8-PSK GSM SYSTEMS

CROSS-REFERENCE TO RELATED APPLICATIONS/INCORPORATION BY REFERENCE

This application is a continuation-in-part of U.S. patent application Ser. No. 11/189,634, filed Jul. 26, 2005, which makes reference to, claims priority to, and claims the benefit of U.S. Provisional Patent Application Ser. No. 60/603,148 filed on Aug. 20, 2004. This patent application also makes reference to U.S. patent application Ser. No. 11/189,509 filed on Jul. 26, 2005.

Each of the above stated applications is hereby incorporated by reference in its entirety.

FIELD OF THE INVENTION

Certain embodiments of the invention relate to data processing in wireless communication systems. More specifically, certain embodiments of the invention relate to a method and system for redundancy-based decoding in 8-PSK GSM systems.

BACKGROUND OF THE INVENTION

In some conventional receivers, improvements may require extensive system modifications that may be very costly and, in some cases, may even be impractical. Determining the right approach to achieve design improvements may depend on the optimization of a receiver system to a particular modulation type and/or to the various kinds of noises that may be introduced by a transmission channel. For example, receiver optimization for wireless systems such as global system for mobile communication (GSM) and general packet radio systems (GPRS) may consider the characteristics of Gaussian minimum shift keying (GMSK) modulation, while receiver optimization for enhanced data rate for GSM evolution (EDGE) systems may consider the characteristics of eight phase shift keying (8-PSK) modulation. In this regard, consideration may be given to, for example, the fact that EDGE system receivers may need to provide three times higher nominal bit rates than GSM receivers systems as 8-PSK modulation transmits three bits-per-symbol in contrast to one bit-per-symbol for GMSK modulation. Improvements in the design and implementation of optimized receivers for decoding convolutional encoded data may require modifications to the various algorithms used by these receivers.

Optimization of a receiver system may also be based on whether the signals being received, generally in the form of successive symbols or information bits, are interdependent. Signals received from, for example, a convolutional encoder, may be interdependent signals, that is, signals with memory. In this regard, a convolutional encoder may generate NRZI or continuous-phase modulation (CPM), which is generally based on a finite state machine operation.

One method or algorithm for signal detection in a receiver system that decodes convolutional encoded data is maximum-likelihood sequence detection or estimation (MLSE). The MLSE is an algorithm that performs soft decisions while searching for a sequence that minimizes a distance metric in a trellis that characterizes the memory or interdependence of the transmitted signal. In this regard, an operation based on the Viterbi algorithm may be utilized to reduce the number of sequences in the trellis search when new signals are received.

Another method or algorithm for signal detection of convolutional encoded data that makes symbol-by-symbol decisions is maximum a posteriori probability (MAP). The optimization of the MAP algorithm is based on minimizing the probability of a symbol error. In many instances, the MAP algorithm may be difficult to implement because of its computational complexity.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for redundancy-based decoding in 8-PSK GSM systems, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for redundancy-based decoding in 8-PSK GSM systems. Aspects of the invention may comprise a burst process that may utilize a gradient search equalization operation to process a received 8-PSK modulated symbol sequence. A frame process may be utilized to generate a redundancy-based decoded output bit sequence based on the burst process results. Iterative steps of the gradient search equalization operation may be utilized to converge to the burst process results. The redundancy-based decoded output bit sequence of the frame process may be fed back to a subsequent burst process. Results from the subsequent burst process may be utilized to generate a subsequent redundancy-based decoded output bit sequence by a subsequent frame process. The fed-back redundancy-based decoded output bit sequence may be combined with results from a Viterbi equalization operation within the subsequent burst process. Symbol-to-bits and bits-to-symbol conversions may be utilized during the burst process and during the subsequent burst process.

Figure 1A:
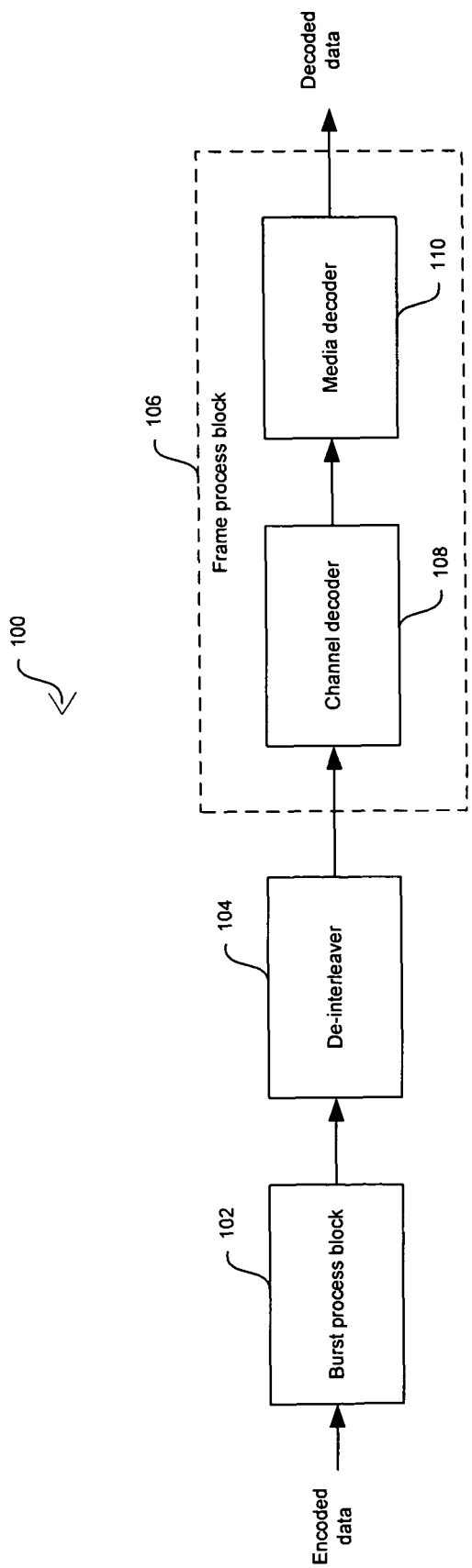
FIG. 1A is a block diagram illustrating a multilayer system for improving decoding, in accordance with an embodiment of the invention.

FIG. 1A is a block diagram illustrating a multilayer system for improving decoding, in accordance with an embodiment of the invention. Referring to FIG. 1A, there is shown a receiver 100 that comprises a burst process block 102, a de-interleaver 104, and a frame process block 106. The frame process block 106 may comprise a channel decoder 108 and a media decoder 110. The receiver 100 may comprise suitable logic, circuitry, and/or code that may enable operation as a wired or wireless receiver. In this regard, the receiver 100 may be utilized in global system for mobile communication (GSM) applications and in extensions of GSM such as general packet radio systems (GPRS) systems and/or enhanced data rate for GSM evolution (EDGE), for example. The receiver 100 may enable utilization of redundancy to decode interdependent signals, such as signals that comprise convolutional encoded data, for example. The receiver 100 may also enable a multilayer approach for improving the decoding of interdependent signals or signals with memory. In this regard, the receiver 100 may enable a burst process and/or a frame process when processing the received interdependent signals. The multilayer approach performed by the receiver 100 may be compatible with a plurality of modulation standards, such as GMSK modulation and/or 8-PSK modulation utilized in GSM applications, for example.

The burst process block 102 may comprise suitable logic, circuitry, and/or code that may enable performing the burst process portion of the decoding operation, which may be done at the receiver 100. The encoded data received by the burst process block 102 may be in the form of successive symbols or information bits, for example. In applications that support 8-PSK modulation, for example, the encoded data may be in the form of successive 3-bit symbols. The burst process block 102 may comprise, for example, a channel estimation operation and/or a channel equalization operation. Results from the channel estimation operation may be utilized by the channel equalization operation to generate a plurality of data bursts based on a maximum-likelihood sequence estimation (MLSE) operation, for example. The output of the burst process block 102 may be transferred to the de-interleaver 104. The de-interleaver 104 may comprise suitable logic, circuitry, and/or code that may enable multiplexing bits from a plurality of data bursts received from the burst process block 102 to form the frame inputs to the frame process block 106. Interleaving may be utilized to reduce the effect of channel fading distortion, for example.

The channel decoder 108 may comprise suitable logic, circuitry, and/or code that may enable decoding the bit sequences in the input frames received from the de-interleaver 104. The channel decoder 108 may be adapted to utilize the Viterbi algorithm during a Viterbi operation to improve the decoding of the input frames. The media decoder 110 may comprise suitable logic, circuitry, and/or code that may enable content specific processing operations on the results of the channel decoder 108 for specified applications. For example, the media decoder 110 may be utilized in applications such as MPEG-4, enhanced full-rate (EFR) or adaptive multi-rate (AMR) speech coder used in GSM, and/or MP3, for example.

In operation, burst processing may be provided as a first processing layer on received encoded data by the burst process block 102. The de-interleaver 104 may multiplex the results generated by the burst process block 102 for generate the appropriate data frames for the frame process block 106. The frame processing provided by the channel decoder 108 and/or the media decoder 110, in the frame process block 106, may correspond to a second processing layer provided by the receiver 100. The output of the frame process block 106 may be decoded data. The operations provided by the receiver 100 may be optimized for GSM applications that utilize 8-PSK modulation or GMSK modulation, for example.

Regarding the frame processing provided by the channel decoder 108 and/or the media decoder 110, a standard approach for decoding convolutional encoded data may be to find the maximum-likelihood sequence estimate (MLSE) for a bit sequence. This may involve searching for a sequence X in which the conditional probability P(X/R) is a maximum, where X is the transmitted sequence and R is the received sequence, by using, for example, the Viterbi algorithm. In some instances, the received signal R may comprise an inherent redundancy as a result of the encoding process performed by the source of the signal. This inherent redundancy may be utilized in the decoding process by developing a MLSE algorithm that may enable meeting at least some of the physical constrains of the signal's source. The use of physical constraints in the MLSE may be expressed as finding a maximum of the conditional probability P(X/R), where the sequence X meets a set of physical constrains C(X) and the set of physical constrains C(x) may depend on the source type and on the application. In this regard, the source type may be a voice, speech, music and/or a video source type, for example.

For example, in speech applications, physical constraints may include gain continuity and smoothness in inter-frames or intra-frames, pitch continuity in voice inter-frames or intra-frames, and/or consistency of line spectral frequency (LSF) parameters that are utilized to represent a spectral envelope. The U.S. application Ser. No. 11/189,509 filed on Jul. 26, 2005, which discloses a method and system decoding video, voice, and speech using redundancy, provides exemplary physical constraints for video, voice, and speech applications and is hereby incorporated herein by reference in its entirety.

In voice transmission applications, such as AMR or EFR in GSM, the physical constraints may be similar to those utilized in general speech applications. Physical constraints in GSM applications may comprise gain continuity and smoothness in inter-frames or intra-frames, pitch continuity in voice inter-frames or intra-frames, continuity of line spectral frequency (LSF) parameters and format locations that are utilized to represent speech. Moreover, GSM applications may utilize redundancy, such as in CRC, as a physical constraint. For example, in GSM applications, enhanced full rate (EFR) coding may utilize 8 bits or 3 bits for CRC, adaptive multi-rate (AMR) coding may utilize 6 bits for CRC, and GSM half rate (GSM-HR) may utilize 3 bits for CRC.

Another approach for decoding convolutional encoded data may be to utilize a maximum a posteriori probability (MAP) algorithm. This approach may utilize a priori statistics of the source bits such that a one-dimensional a priori probability, $p(b_i)$, may be generated, where $b_i$ corresponds to a current bit in the bit sequence to be encoded. To determine the MAP sequence, the Viterbi transition matrix calculation may need to be modified. This approach may be difficult to implement in instances where complicated physical constraints and when the correlation between bits $b_i$ and $b_j$, where i and j are far apart, may not be easily determined. In cases where a parameter domain has a high correlation, the MAP algorithm may be difficult to implement. Moreover, the MAP algorithm may not be utilized in cases where inherent redundancy, such as for CRC, is part of the physical constraints.

The maximum-likelihood sequence estimate (MLSE) for a symbol or bit sequence may be a preferred approach for decoding convolutional encoded data. A general solution for the maximum of the conditional probability P(X/R), where R meets a certain set of physical constraints C(X), for the MLSE may still be difficult implement. In this regard, an efficient solution may require a suboptimal solution that takes into consideration complexity and implementation of the physical constraints.

Figure 1B:
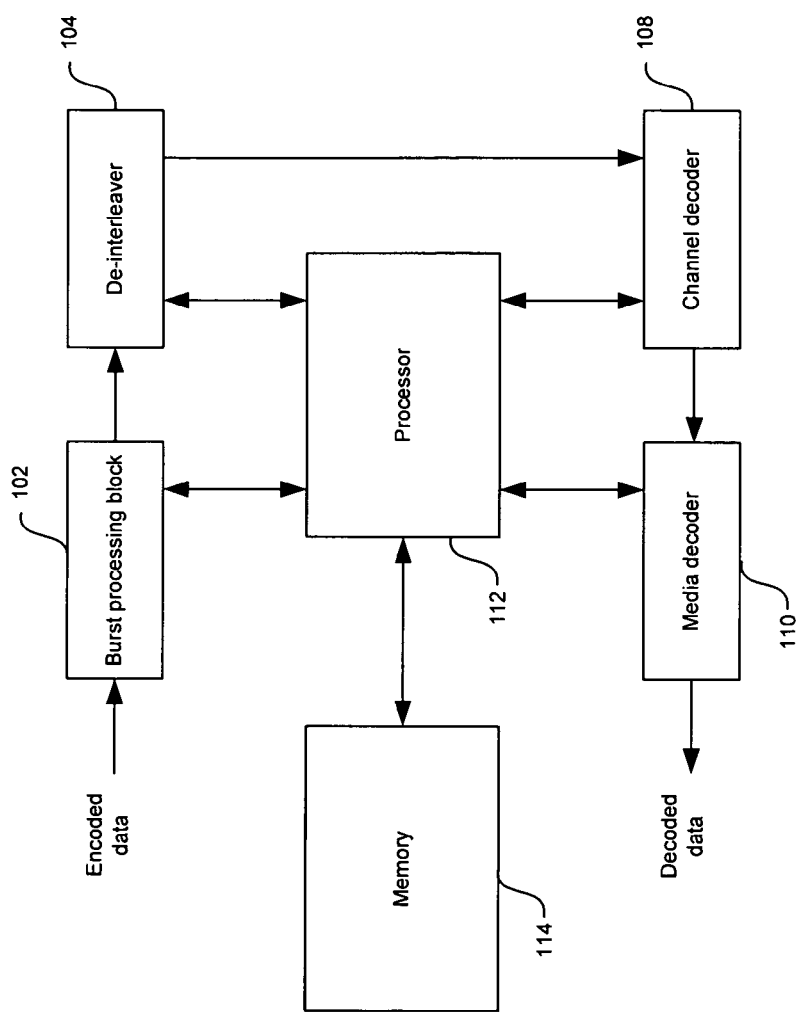
FIG. 1B is a block diagram illustrating a multilayer system with a processor and memory for improving decoding, in accordance with an embodiment of the invention.

FIG. 1B is a block diagram illustrating a multilayer system with a processor and memory for improving decoding, in accordance with an embodiment of the invention. Referring to FIG. 1B, there is shown a processor 112, a memory 114, the burst process block 102, a de-interleaver 104, the channel decoder 108 and the media decoder 110. The processor 112 may comprise suitable logic, circuitry, and/or code that may enable computations and/or management operations. The processor 112 may also enable communication with and/or control of at least a portion of the operations provided by the burst process block 102, the de-interleaver 104, the channel decoder 108 and/or the media decoder 110. The memory 114 may comprise suitable logic, circuitry, and/or code that may enable storage of data and/or control information. The memory 114 may enable storage of information that may be utilized and/or that may be generated by the burst process block 102, the de-interleaver 104, the channel decoder 108, and/or the media decoder 110. In this regard, information may be transferred to and/or from the memory 114 via the processor 112, for example.

When more than one application is supported by the system in FIG. 1B, the processor 112 may be utilized to adapt and/or modify the operations of the burst process block 102, the de-interleaver 104, the channel decoder 108, and/or the media decoder 110. For example, when GMSK and 8-PSK are supported for GSM communication, the processor 112 may adapt and/or modify operations to optimize the decoding of interdependent signals, such as convolutional encoded data. In order to enable such optimization, 8-PSK modulation may be distinguished from other modulation formats, such as the GMSK modulation, for example.

Figure 2B:
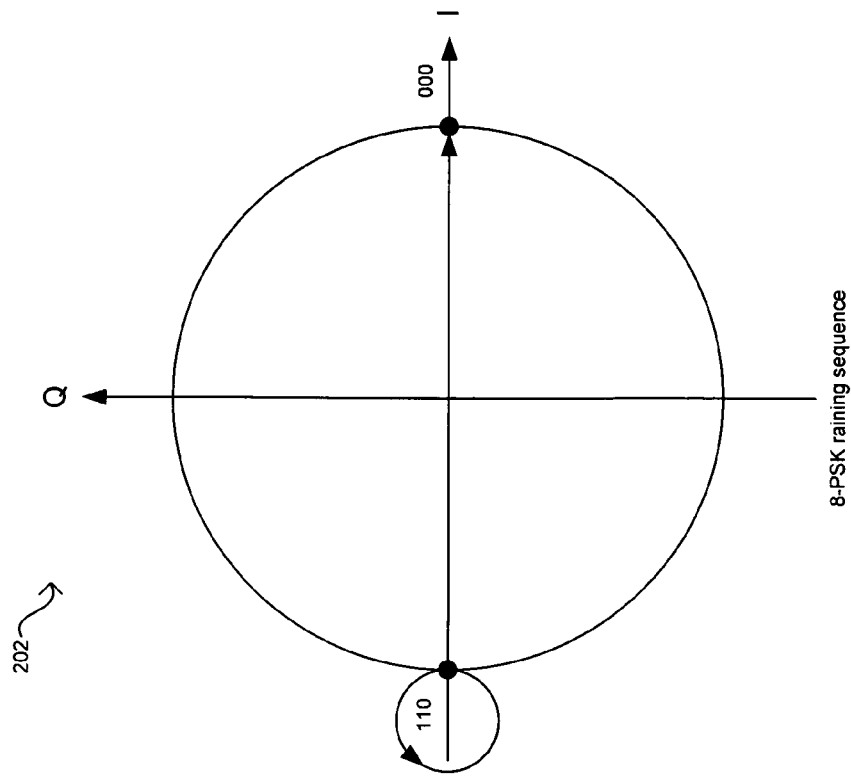
FIGS. 2A-2B are diagrams illustrating exemplary payload and training sequence constellations for 8-PSK modulation, in connection with an embodiment of the invention.
Figure 2A:
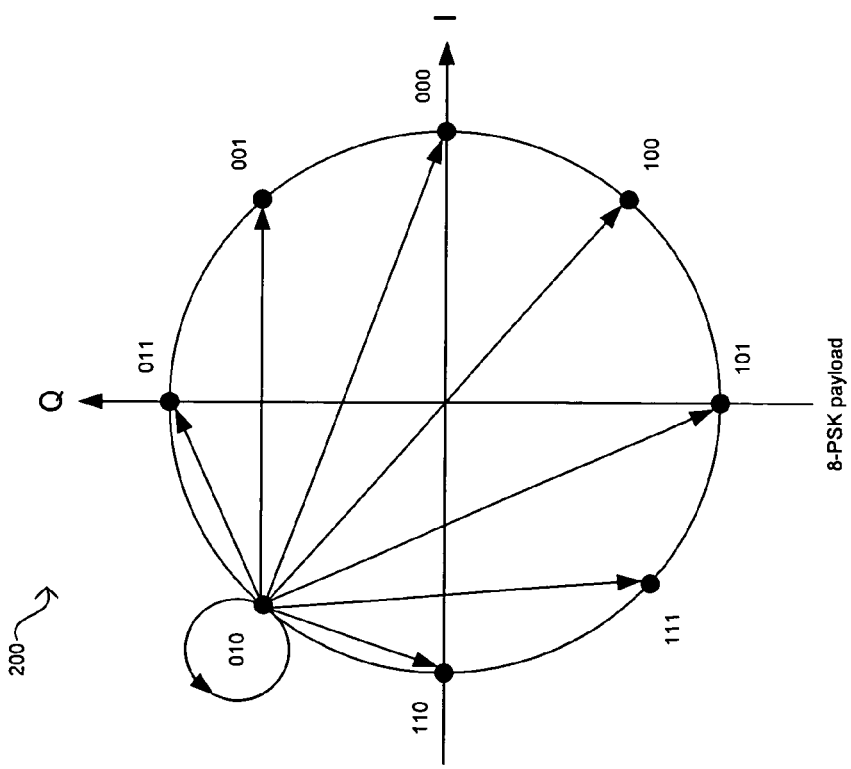

FIGS. 2A-2B are diagrams illustrating exemplary payload and training sequence constellations for 8-PSK modulation, in connection with an embodiment of the invention. Referring to FIG. 2A, there is shown a constellation 200 that may comprise eight standard payload phase states as defined for 8-PSK modulation. Three bits may be utilized to represent each payload phase state. Starting from the positive in-phase (I) component axis and reading counterclockwise, the payload phase states may be 000, 001, 011, 010, 110, 111, 101, and 100. FIG. 2A illustrates exemplary transitions that may occur as a signal moves from one phase state to another phase state or stays at the same phase state. Referring to FIG. 2B, there is shown a constellation 202 that may comprise two standard training sequence phase states as defined for 8-PSK modulation. Three bits may be utilized to represent each payload phase state. Starting from the positive I-axis and reading counterclockwise, the training sequence phase states may be 000 and 110. FIG. 2B illustrates exemplary transitions that may occur as a signal moves from one phase state to another phase state or stays at the same phase state.

Symbol transitions between the payload phase states 010 and 100 in FIG. 2A and between the transition sequence phase states 110 and 000 in FIG. 2B may require the instantaneous vector to cross the origin, resulting in the need for large dynamic range power requirements. Using a $3\pi/8$ phase rotation on each symbol in the constellations 200 and 202 may reduce this requirement. Moreover, based on knowledge of the training sequence, a receiver may distinguish between signals modulated using GMSK and 8-PSK formats by determining the rotation amount during the training sequence. This process may also be referred to as blind detection.

Figure 3:
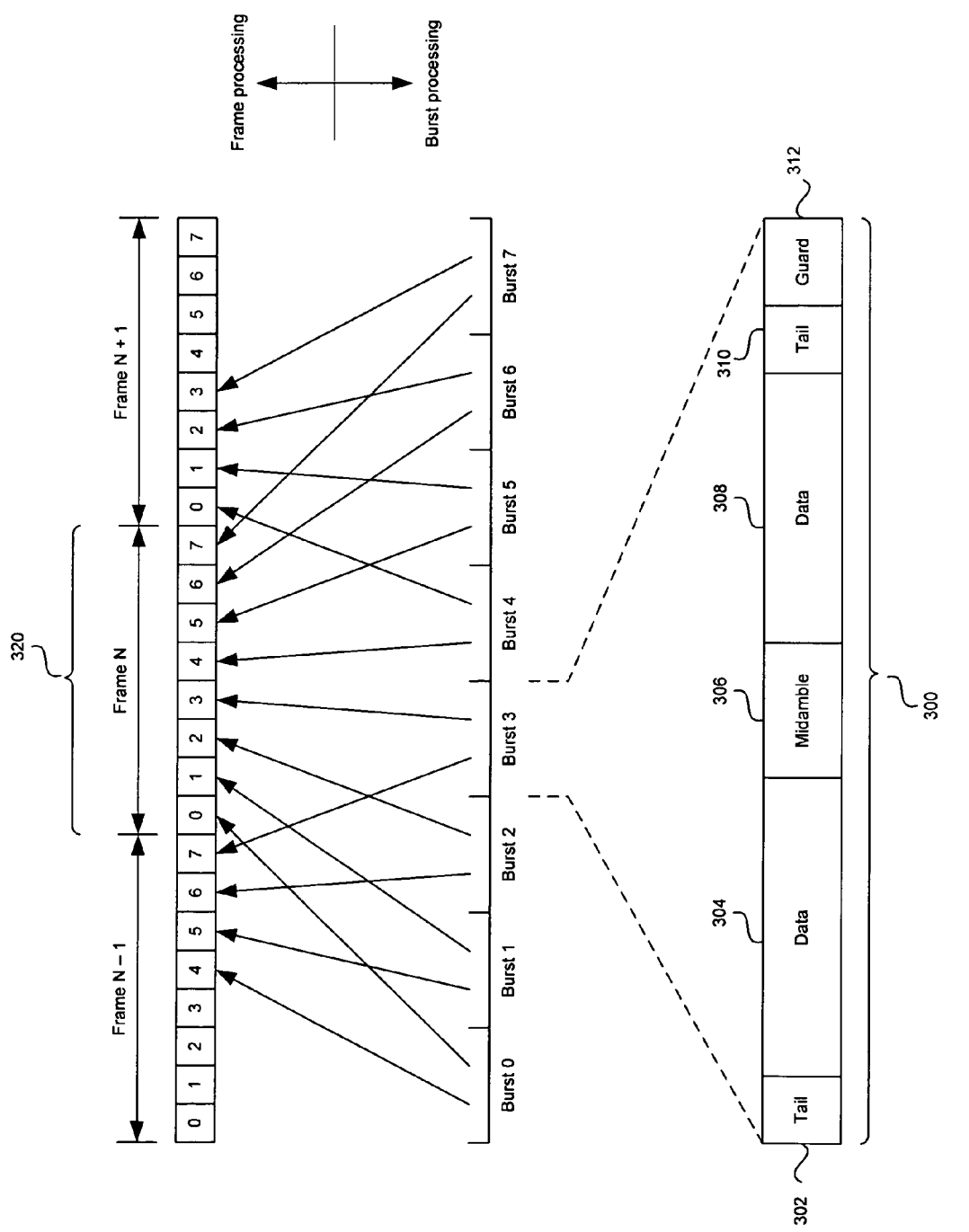
FIG. 3 is a diagram illustrating exemplary combined frame and burst processes in 8-PSK enhanced data rate GSM applications, in accordance with an embodiment of the invention.

FIG. 3 is a diagram illustrating exemplary combined frame and burst processes in 8-PSK enhanced data rate GSM applications, in accordance with an embodiment of the invention. Referring to FIG. 3, there is shown a series of at least one time slot burst 300 and a series of at least one frame 320. The series of at least one time slot burst 300, as shown, may correspond to Burst 0 through Burst 7, while the series of at least one frame 320, as shown, may correspond to Frame N−1 through Frame N+1. The series of at least one time slot burst 300 may be generated during the burst processing of the receiver 100 in FIG. 1A, while the series of at least one frame 320 may be generated during the frame processing of the receiver 100.

The time slot burst 300 may correspond to the structure of an EDGE burst mapped to a 156-symbol timeslot that utilizes 8-PSK modulation, that is, three (3) bits per symbol. The time slot burst 300 may comprise a tail 302, first data 304, a midamble 306, second data 308, a tail 310, and guard 312. The tail 302 and the tail 310 may comprise 3 symbols each, for example. The first data 304 and the second data 308 may comprise 58 symbols each, for example. The guard 312 may comprise 8 symbols, for example. The midamble 306 may comprise 26 symbols and may be utilized as a training sequence for channel equalization, for example. When the EDGE burst is mapped to a 157-symbol timeslot, the guard 312 in time slot burst 300 may comprise 9 symbols, for example. The frame 320 may comprise eight partitions or sequences of bits.

As shown, the symbols in the first data 304 in Burst 0 through Burst 3 may be transferred to the fifth, sixth, seventh, and eight sequences of Frame N−1 respectively, for example. The symbols in the first data 304 in Burst 4 through Burst 7 may be transferred to the fifth, sixth, seventh, and eight sequences of Frame N respectively, for example. The symbols in the second data 308 in Burst 0 through Burst 3 may be transferred to the first, second, third, and fourth sequences of Frame N respectively, for example. The symbols in the second data 308 in Burst 4 through Burst 7 may be transferred to the first, second, third, and fourth sequences of Frame N+1 respectively, for example. The decoding of bit sequences corresponding to the symbols transferred from the time slot bursts in the burst processing to the frames in the frame processing may be performed by utilizing the Viterbi algorithm to reduce the number of sequences utilized during the decoding search. In this regard, utilizing signal redundancy and at least one physical constraint may result in a more accurate decoding operation. The following example illustrates the application of a multilayer solution that efficiently implements physical constraints into the decoding of voice data in GSM applications.

Figure 4A:
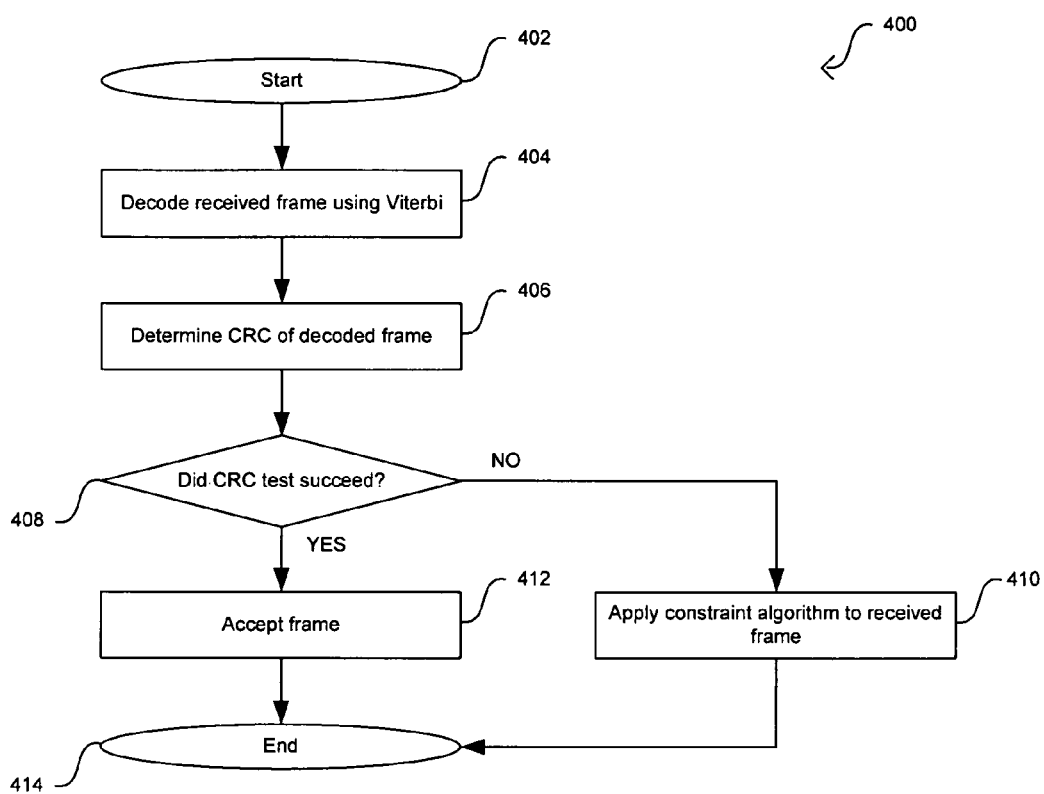
FIG. 4A is a flow diagram illustrating exemplary steps in the application of redundancy to a multilayer process, in accordance with an embodiment of the invention.

FIG. 4A is a flow diagram illustrating exemplary steps in the application of redundancy to a multilayer process, in accordance with an embodiment of the invention. Referring to FIG. 4A, after start step 402, in step 404, the receiver 100 in FIG. 1A may decode a received frame in the frame process block 106 by utilizing the Viterbi algorithm. In step 406, a redundancy verification parameter, such as the CRC, may be determined for the decoded frame. In step 408, the receiver 100 may determine whether the CRC verification test was successful. When the CRC verifies the decoded frame, the receiver 100 may proceed to step 412 where the decoded frame is accepted. After step 412, the receiver 100 may proceed to end step 414.

Returning to step 408, when the CRC verification test is not successful for the decoded frame, the receiver 100 may proceed to step 410. In step 410, the receiver 100 may perform a redundancy algorithm that may be utilized to provide a decoding performance that may result in equal or reduced decoding errors than those that may occur from utilizing the standard Viterbi algorithm. After step 410, the receiver 100 may proceed to end step 414.

For GSM applications, for example, the redundancy algorithm may comprise searching for the MLSE that may also meet the CRC condition and the speech constraints. In this regard, a set of k bit sequences {S1, S2, . . . , Sk} may be determined from the MLSE that meet the CRC constraint. Once the set of k sequences is determined, a best sequence, Sb, may be determined that also meets the GSM voice or speech constraints.

Figure 4B:
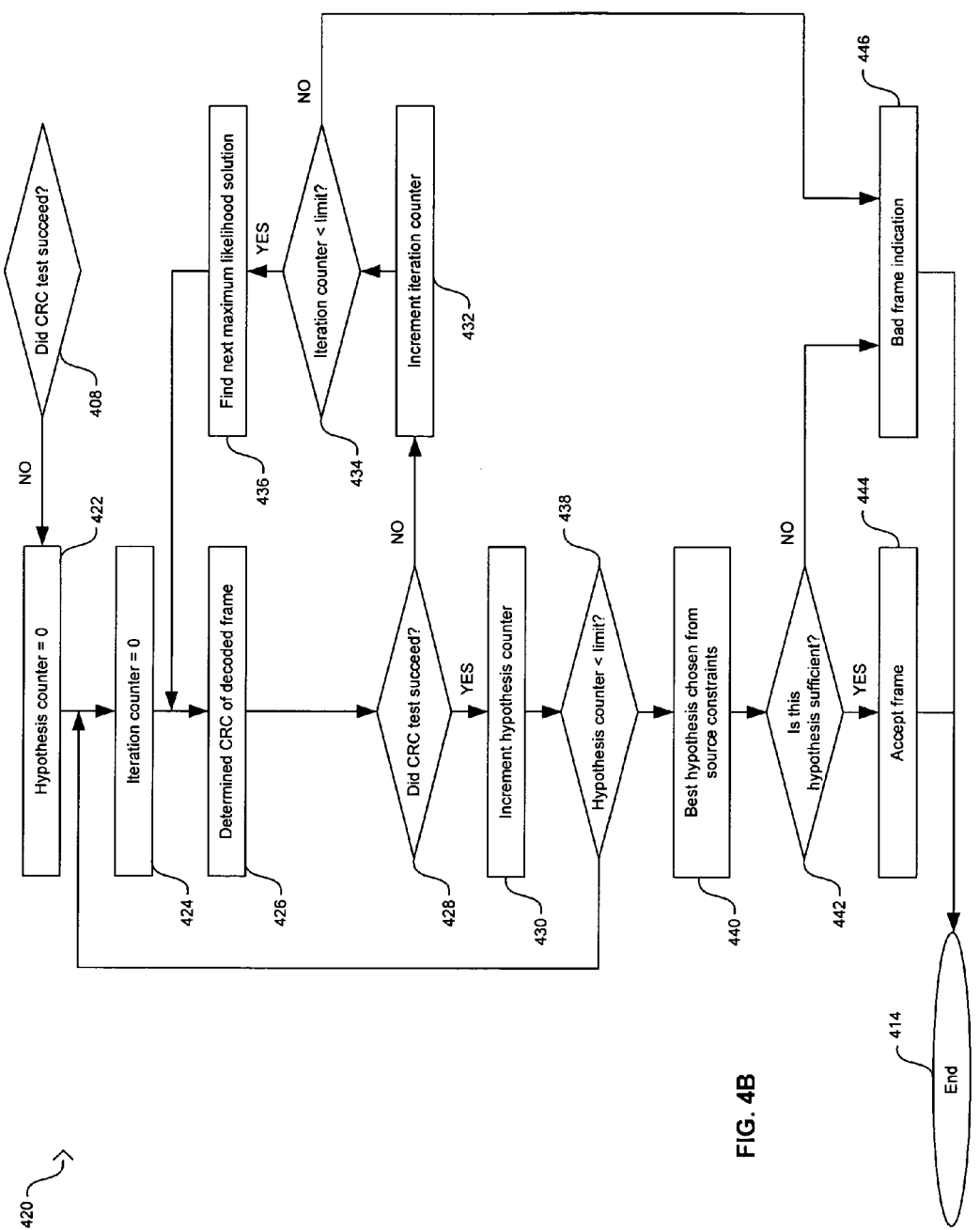
FIG. 4B is a flow diagram illustrating exemplary steps in the application of a constraint algorithm to a received frame, in accordance with an embodiment of the invention.

FIG. 4B is a flow diagram illustrating exemplary steps in the application of a constraint algorithm to a received frame, in accordance with an embodiment of the invention. Referring to FIG. 4B, when the CRC verification test is not successful for the decoded frame in step 408 in FIG. 4A, the receiver 100 in FIG. 1A may proceed to step 422. In step 422, a hypothesis counter may be set to an initial counter value to indicate a first hypothesis for consideration, for example. The initial counter value in step 422 may be zero, for example. After step 422, an iteration counter may be set to an initial counter value in step 424 to indicate a first maximum likelihood solution, for example. The initial counter value in step 424 may be zero, for example. In step 426, the CRC of the decoded frame may be determined.

In step 428, the receiver 100 may determine whether the CRC verification test was successful for the current hypothesis. When the CRC verification test is not successful, the operation may proceed to step 432. In step 432, the iteration counter may be incremented. After step 432, in step 434, the receiver 100 may determine whether the iteration counter is less than a predetermined limit. When the iteration counter is higher or equal to the predetermined limit, the operation may proceed to step 446 where a bad frame indication is generated. When the iteration counter is less than the predetermined limit, the operation may proceed to step 436 where a next maximum likelihood solution may be determined. After step 436, the operation may proceed to step 426 where the CRC of the decoded frame may be determined based on the maximum likelihood solution determined in step 426.

Returning to step 428, when the CRC verification test is successful, the operation may proceed to step 430. In step 430, the hypothesis counter may be incremented. After step 430, in step 438, the receiver 100 may determine whether the hypothesis counter is less than a predetermined limit. When the hypothesis counter is less than the predetermined limit, the operation may proceed to step 424 where the iteration counter may be set to an initial value. When the hypothesis counter is equal the predetermined limit, the operation may proceed to step 440 where the best hypothesis may be chosen from the source constraints.

After step 440, in step 442, the receiver 100 may determine whether the best hypothesis chosen in step 440 is sufficient to accept the decoded frame. When the chosen hypothesis is sufficient to accept the decoded frame, the operation may proceed to step 444 where the decoded frame may be accepted. When the chosen hypothesis is not sufficient to accept the decoded frame, the operation may proceed to step 446 where a bad frame indication is generated. After step 444 or step 446, the operation may proceed to end step 414 in FIG. 4A.

Figure 5A:
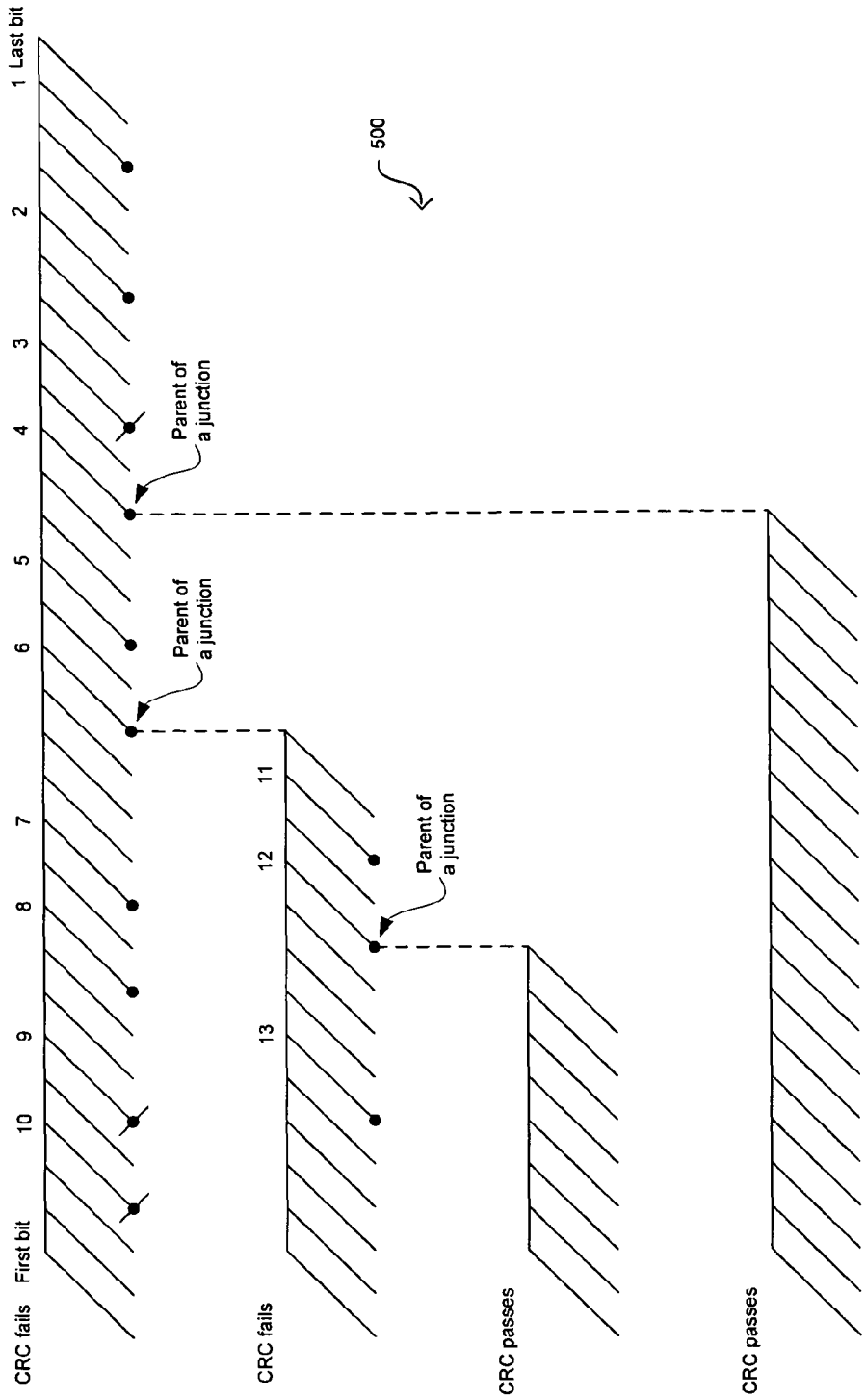
FIG. 5A is diagram illustrating an exemplary search process for a T hypothesis that meets CRC constraint, in accordance with an embodiment of the invention.

FIG. 5A is diagram illustrating an exemplary search process for a T hypothesis that meets CRC constraint, in accordance with an embodiment of the invention. Referring to FIG. 5A, the search tree 500 may correspond to an exemplary sequence search process that may start with the reduced set of estimated bit sequences generated by a Viterbi operation. In this regard, the top horizontal row corresponds to a set of N trellis junctions that may result from the Viterbi operation. The main sequence metric and the metric of main sequence junctions may be obtained during the Viterbi calculation. The metric of other sequences may be obtained from the sum of the parent sequence metric and the junction metric. Each of the trellis junctions is shown as a diagonal line and corresponds to an estimated bit sequence from the Viterbi operation. The estimated bit sequences in the top row do not meet the CRC constraint. In the redundancy algorithm, a set of estimated bit sequences may be selected from those in the top row. As shown, 10 estimated bit sequences may be selected, for example, from the N trellis junctions. The 10 selected estimated bit sequences may be shown as having a dark circle at the end of the diagonal line. In this regard, the selection may depend on a metric parameter, where the metric parameter may, in some instances, comprise a channel metric portion and a physical constraint metric portion.

The search process for a T hypothesis that meets the CRC or redundancy verification parameter for GSM may start with the selected trellis junction with the highest metric. In this example, the junction labeled 6 has the highest metric and the search process may start at that point. A new search tree 500 branch or row may be created from the junction labeled 6 and a trace back pointer may be utilized to track the search operation. The new branch or row results in three additional estimated bit sequences or three junctions labeled 11 through 13. As a result, the three junctions in the top row with the lowest metrics, junctions 3, 9, and 10, may be dropped. This is shown by a small dash across the dark circle at the end of the diagonal line. Again, the new branch or row is verified for CRC. As shown, the CRC fails for this new branch and a next branch may be created from the junction with the highest metric or junction 12 as shown. In this instance, the branch that results from junction 12 meets the CRC constraint and the search process may return to the top row and to the junction with the next highest metric. The estimated bit sequence associated with junction 12 may be selected as one of the bit sequences for the set of k sequences {S1, S2, . . . , Sk}.

Junction 4 represents the next highest metric after junction 6 on the top row and a new branch or row may be created from junction 4. In this instance, the new branch meets the CRC constraint and the estimated bit sequence associated with junction 4 may be selected as one of the bit sequences for the set of k sequences {S1, S2, . . . , Sk}. This approach may be followed until the limit of k sequences is exceeded or the search from all the remaining selected junctions is performed. In this regard, a plurality of trace back pointers may be calculated during the search operation. The size of the set of k bit sequences {S1, S2, . . . , Sk} may vary.

Figure 5B:
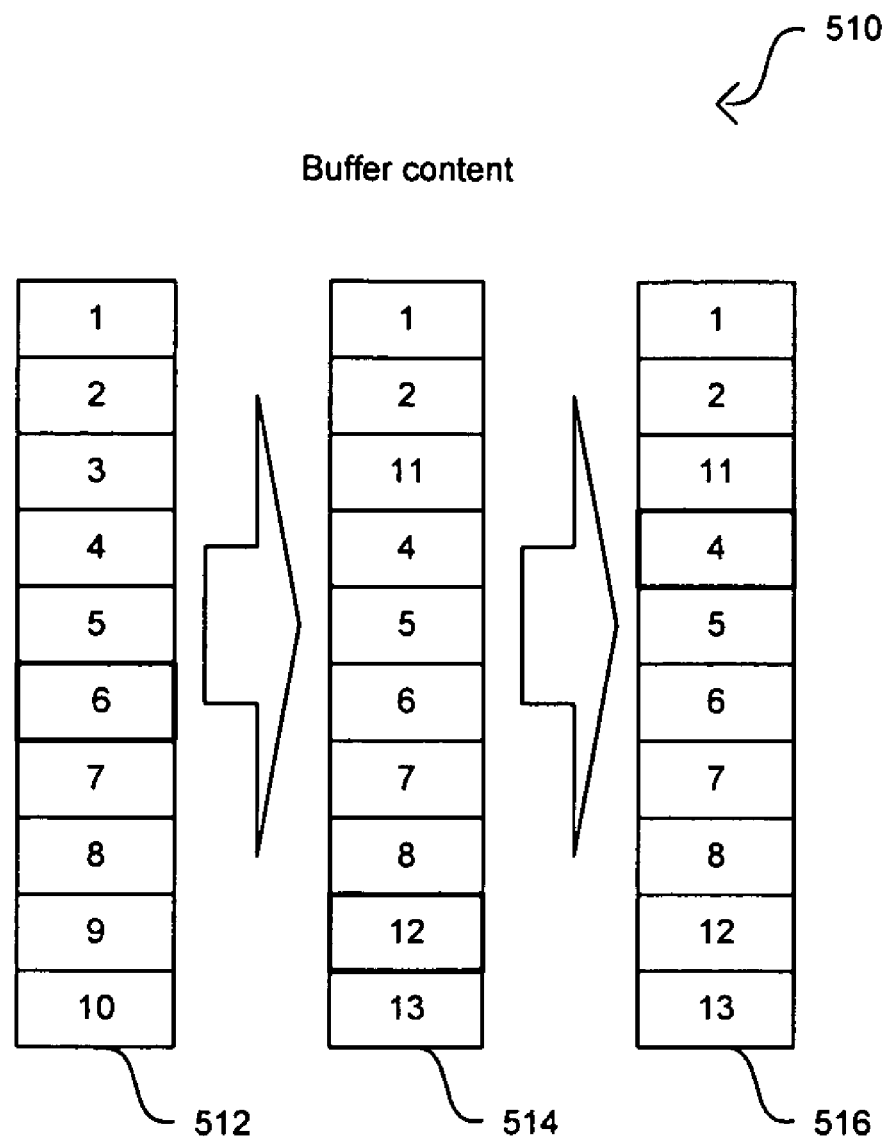
FIG. 5B is a diagram illustrating exemplary buffer content during the search process described in FIG. 5A, in accordance with an embodiment of the invention.

FIG. 5B is a diagram illustrating exemplary buffer content during the search process described in FIG. 5A, in accordance with an embodiment of the invention. Referring to FIG. 5B, there is shown a buffer content 510 that may correspond to the junction labels under consideration during the search process. For example, state 512 may correspond to the initial 10 junctions in the search operation. In this regard, junction 6 is highlighted to indicate that it corresponds to the highest metric value and is the starting point of a new branch or row. Step 514 may correspond to the next set of 10 junctions. In this instance, junctions 3, 9, and 10 have been replaced with junctions 11, 12, and 13 that resulted from the branch created from junction 6. Junction 12 is highlighted to indicate that is corresponds to the highest metric value and is the starting point of a new branch or row. State 516 may correspond to the next set of 10 junctions. In this instance, junction 4 is highlighted to indicate that is corresponds to the highest metric value and is the starting point of a new branch or row. Trace back pointers may be calculated at each state to track the search process.

Figure 5C:
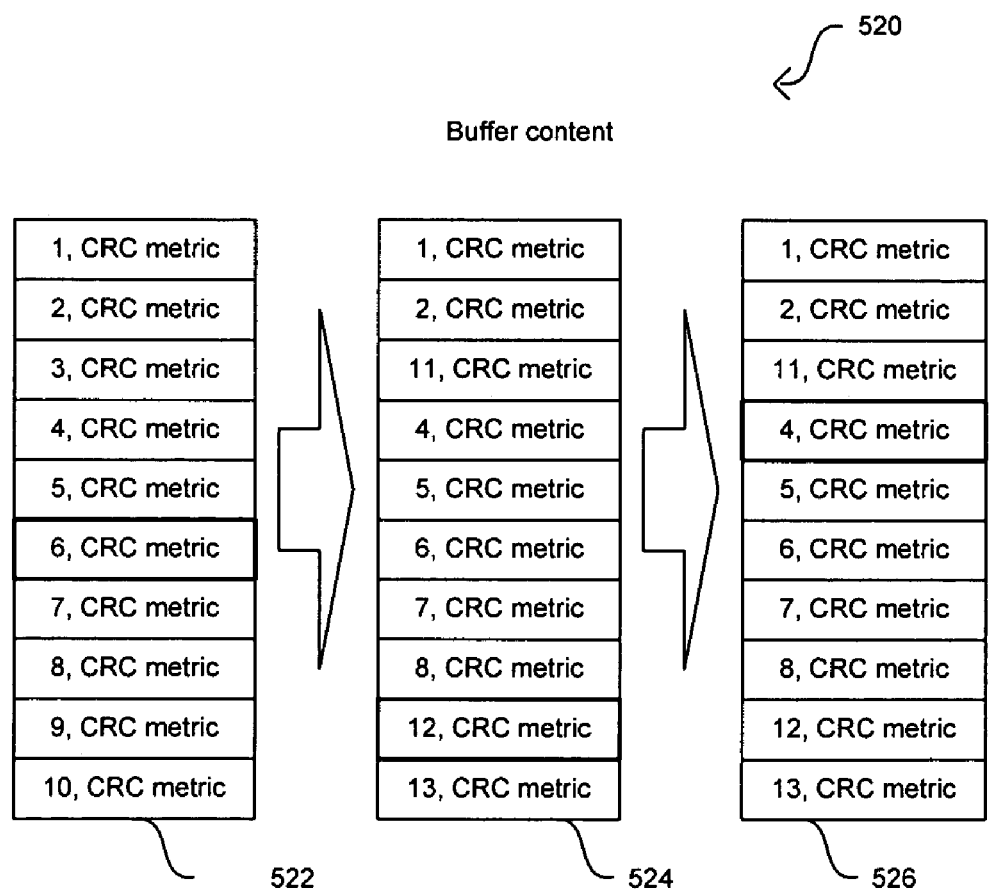
FIG. 5C is a diagram illustrating exemplary buffer content when CRC and trace back pointers are calculated simultaneously during the search process described in FIG. 5A, in accordance with an embodiment of the invention.

FIG. 5C is a diagram illustrating exemplary buffer content when CRC and trace back pointers are calculated simultaneously during the search process described in FIG. 5A, in accordance with an embodiment of the invention. Referring to FIG. 5C, there is shown a buffer content 520 that may correspond to the junction labels under consideration during the search process and the corresponding CRC calculations. As with FIG. 5B, the buffer content 520 may vary its contents based on a current state. For state 522, state 524, and state 526, the contents that correspond to the current junctions under consideration are the same as in state 512, state 514, and state 516 in FIG. 5B respectively. However, in order to simplify the search process for T hypothesis, the CRC and the trace back pointers for the states may be calculated simultaneously. This approach is possible because the CRC may be calculated as sum($b_i R_i$), where $R_i$ is the remainder of $xi/g(x)$, $g(x)$ is the generator polynomial of the CRC, and $b_i$ is the value of the bit i. The CRC metric of each sequence may be kept or stored in the buffer content 520. The CRC metric may be obtained as the sum of the biRi values from the junction to the last bit, and may also be determined as the sum of the parent sequence CRC metric and sum of the biRi values from junction to its parent. The sequence may meet the CRC condition if the CRC metric is equal to the sum of the biRi values from first bit to the junction. The values for $R_i$ may be stored in, for example, a look up table.

Once the set of k sequences {S1, S2, . . . , Sk} has been determined by following the search as described in FIGS. 5A-5C, the redundancy algorithm may require that the receiver 100 in FIG. 1A selects one of the bit sequences as the best bit sequence, Sb, that meets the CRC constrain and the physical constrains with the highest level of confidentiality. The best bit sequence may also be referred to as the decoded output bit sequence of the multilayer process.

For each of the candidate bit sequences in the set of k bit sequences {S1, S2, . . . , Sk}, a set of T1 different physical constraint tests, {Test(j), . . . , Test(T1)}, may be performed. The physical constraint tests correspond to tests of quantifiable characteristics of the type of data received for a particular application. The scores of the physical constraint tests for an $i^{th}$ bit sequence, {T_SC(i, j), . . . , T_SC(i, T1)}, may be utilized to determine whether the bit sequence passed or failed a particular test. For example, when T_SC(i, j)>0, the $i^{th}$ bit sequence is said to have failed the $j^{th}$ physical constraint test. When the T_SC(i, j)<=0, the $i^{th}$ bit sequence is said to have passed the $j^{th}$ physical constraint test. In some instances, when the value of a test score is smaller, the reliability of the score may be increased.

Once the physical constraint tests are applied to the candidate estimated bit sequences, the following exemplary approach may be followed: when a score is positive, the candidate bit sequence may be rejected; for a particular physical constraint test, the candidate with the best score or with the lowest score value may be found; the candidate that is selected as the best score for the most number of tests may be selected as the best bit sequence, Sb.

TABLE 1

| Candidate | Test (1) | Test (2) | Test (3) | Test (4) |
|---|---|---|---|---|
| S1 | Score (1, 1) < 0 | Score(1, 2) < 0 | Score(1, 3) < 0 | Score(1, 4) < 0 |
| S2 | Score (2, 1) < 0 | Score(2, 2) > 0 | Score(2, 3) < 0 | Score(2, 4) < 0 |
| S3 | Score (3, 1) < 0 | Score(3, 2) < 0 | Score(3, 3) < 0 | Score(3, 4) < 0 |
| S4 | Score (4, 1) < 0 | Score(4, 2) < 0 | Score(4, 3) < 0 | Score(4, 4) > 0 |
| S5 | Score (5, 1) < 0 | Score(5, 2) < 0 | Score(5, 3) < 0 | Score(5, 4) < 0 |
| Minimum score sequence | S3 | S5 | S3 | S3 |

Table 1 illustrates an exemplary embodiment of the invention in which a set of five candidate bit sequences, {S1, S2, S3, S4, and S5}, may be tested using a set of four physical constraint tests, {Test(1), Test(2), Test(3), and Test(4)}. The scores may be tabulated to identify passing and failing of various tests for each of the candidate bit sequences. In this instance, S2 and S4 are rejected for having positive scores for Test(2) and Test(4) respectively. The bit sequence S3 is shown to have the lowest score in Test(1), Test(3), and Test(4) and may be selected as the best bit sequence, Sb.

Some characteristic physical constraint tests that may be utilized by, for example, adaptive multi-rate (AMR) coding are LSF parameters, gain, and/or pitch. For the LSF parameters, some of the tests may be based on the distance between two formants, changes in consecutive LSF frames or sub-frames, and the effect of channel metrics on the thresholds. For example, the smaller the channel metric, the more difficult it is to meet the threshold. Regarding the use of gain as a physical constraint test, the criteria may be smoothness or consistency between consecutive frames or sub-frames. Regarding pitch, the criteria may be the difference in pitch between frames or sub frames.

Figure 6:
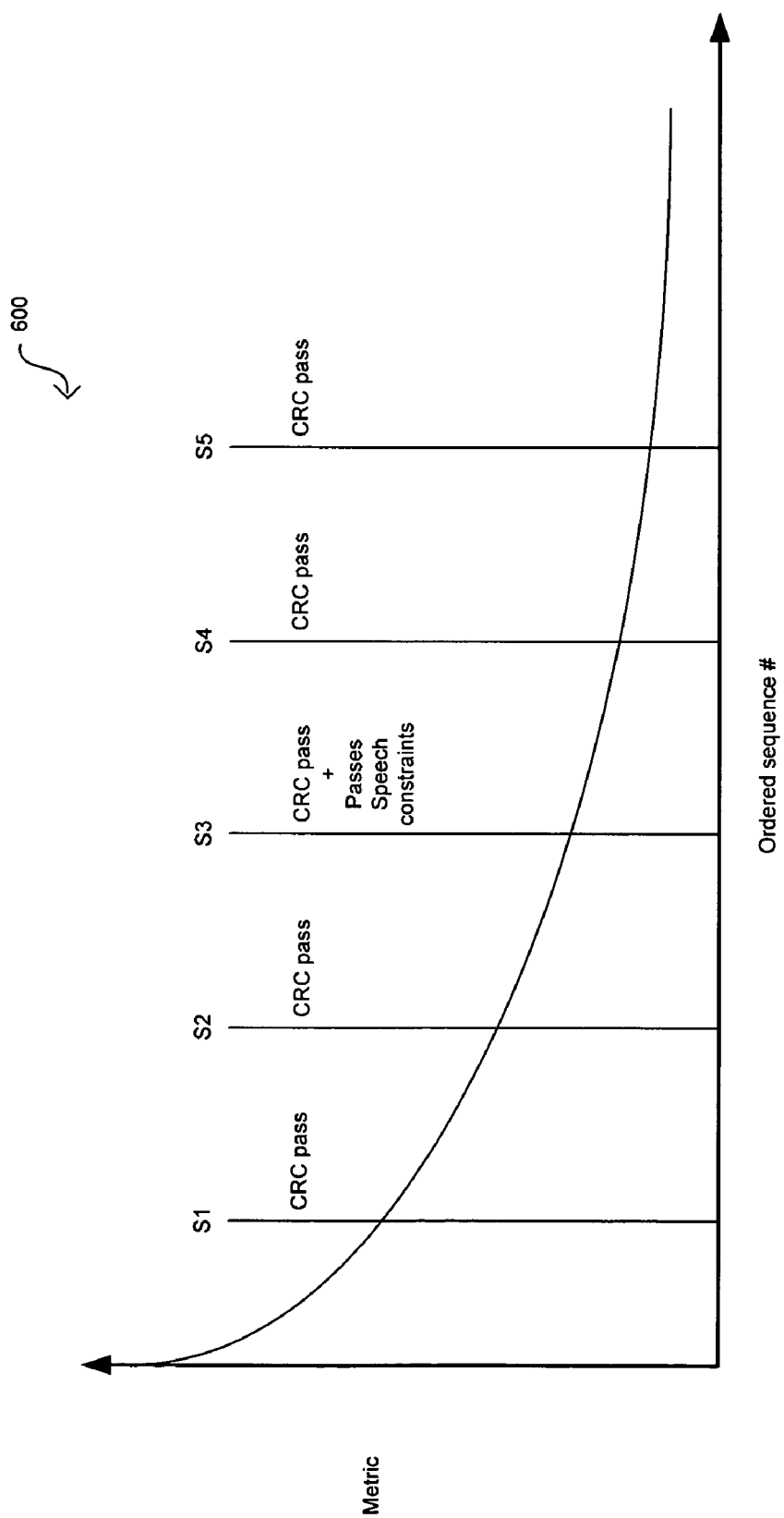
FIG. 6 is a graph illustrating exemplary set of sequences that meets CRC and speech constraints, in accordance with an embodiment of the invention.

FIG. 6 is a graph illustrating exemplary set of sequences that meets CRC and speech constraints, in accordance with an embodiment of the invention. Referring to FIG. 6, there is shown the result of the redundancy algorithm. For example, the search process for T hypothesis as shown in FIGS. 5A-5C may result in the set of bit sequences {S1, S2, S3, S4, and S5}. These bit sequences were selected based on their metric values and passing the CRC verification. The set of bit sequences were also required to pass physical constraint tests as described herein. In this instance, the bit sequence S3 has been shown to meet the CRC verification and the physical constraint test and may be selected as the best bit sequence, Sb.

Figure 7:
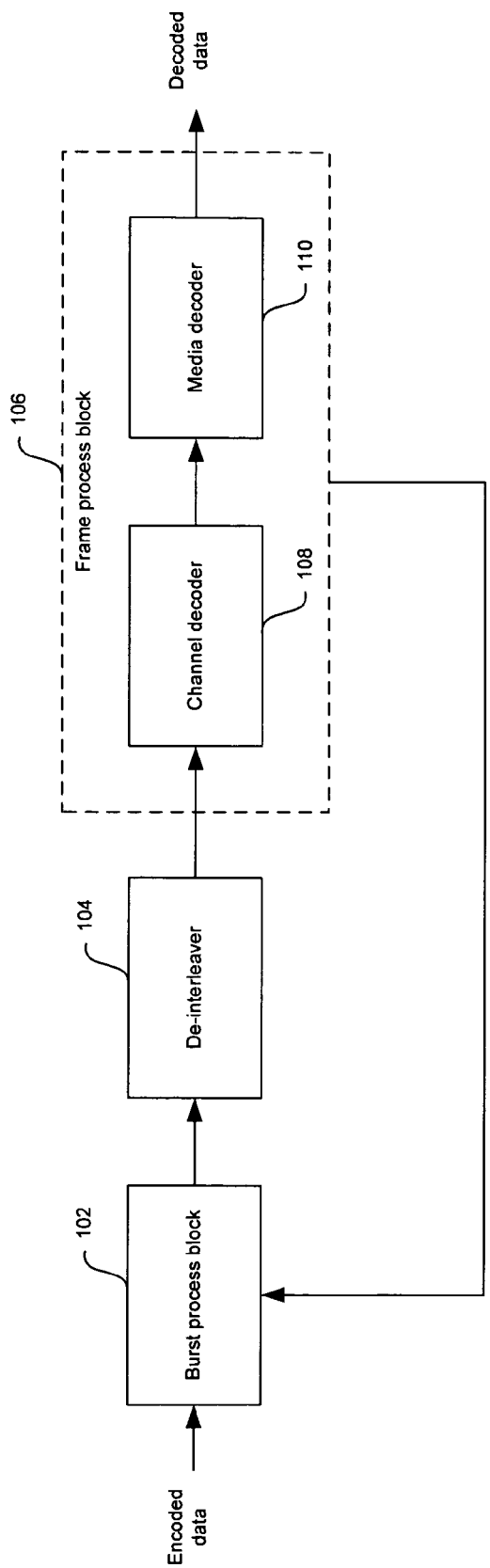
FIG. 7 is a block diagram illustrating an iterative multilayer approach for improving decoding, in accordance with an embodiment of the invention.

FIG. 7 is a block diagram illustrating an iterative multilayer approach for improving decoding, in accordance with an embodiment of the invention. Referring to FIG. 7, there is shown the receiver 100 in FIG. 1A with a feedback signal from the frame process portion of the multilayer decoding approach to the burst process portion of the multilayer decoding approach. The frame process may comprise the use of redundancy verification of the results generated by the Viterbi algorithm and the use of physical constraints to reduce decoding errors that may result from the standard Viterbi algorithm. The burst process may utilize information decoded in the frame process as an input to improve the channel estimation and channel equalization operations.

Figure 8:
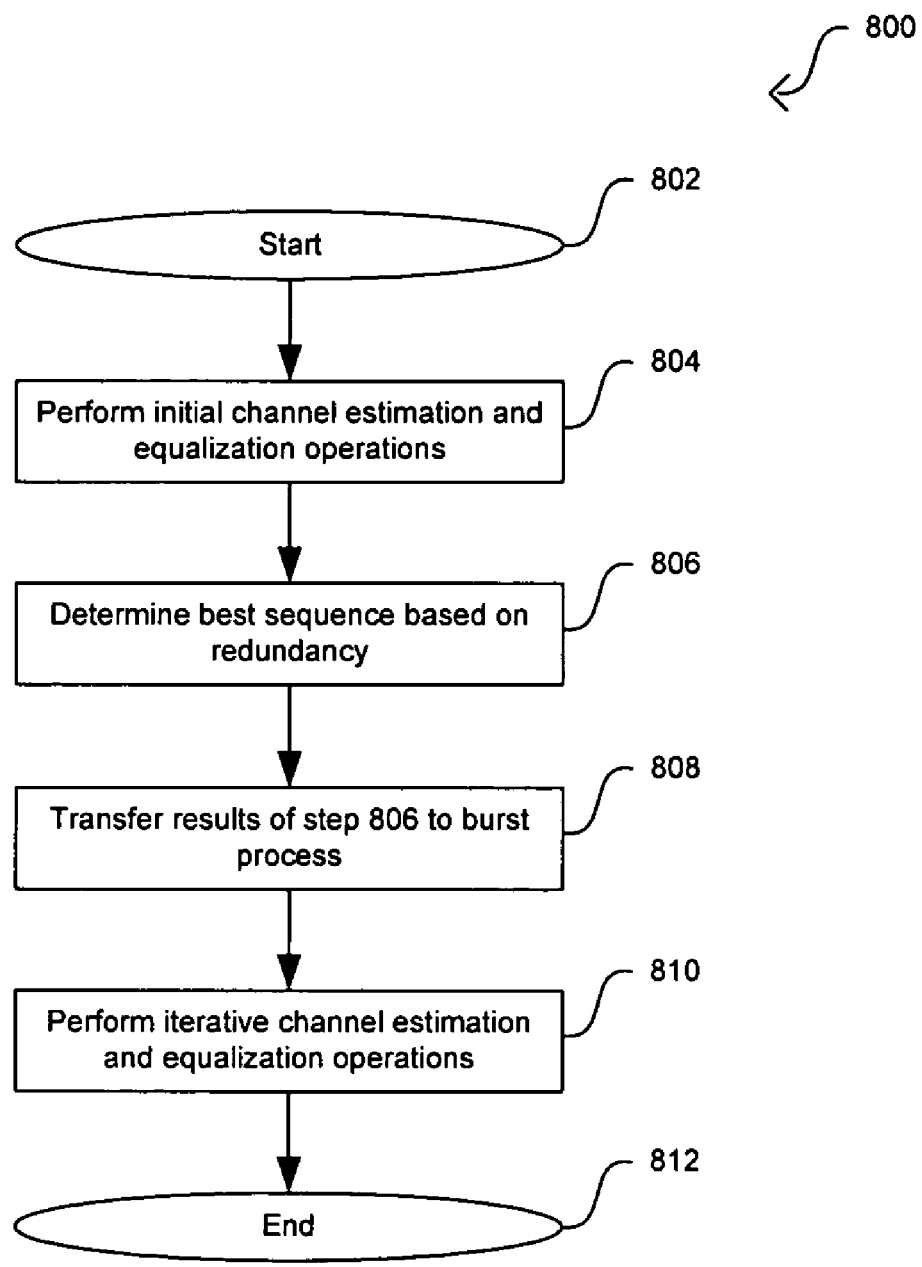
FIG. 8 is a flow diagram illustrating exemplary steps in the iterative multilayer approach for improving decoding, in accordance with an embodiment of the invention.

FIG. 8 is a flow diagram illustrating exemplary steps in the iterative multilayer approach for improving decoding, in accordance with an embodiment of the invention. Referring to FIG. 8, after start step 802, in step 804, an initial or first iteration of a channel estimation operation and of an equalization operation may be performed on received signals during a burst process portion of the multilayer decoding approach. The first iteration of the channel estimation operation and the first iteration of the equalization operation may be performed by, for example, the burst process block 102 in FIG. 7. In step 806, decoding of a received signal frame may be performed during the frame processing portion of the multilayer decoding approach. The frame processing may be performed by, for example, the frame process block 106 in FIG. 7. In step 808, at least a portion of the results generated in step 806 by the frame process portion of the multilayer decoding approach may be transferred from, for example, the frame process block 106 to the burst process block 102 via a feedback signal. In step 810, the burst processing may perform a second iteration of the channel estimation operation and a second iteration of the equalization operation based on the decoded results provided from the frame process portion of the multilayer decoding approach. After step 810, the flow diagram 800 may proceed to end step 812. The improved results of the burst process may be further interleaved and processed by the frame process. The frame process may utilize a standard frame process or determine the best sequence that may be utilized based on, for example, redundancy.

The iterative multilayer approach described in FIG. 8 may be utilized in a many different applications, for example, in digital video broadcasting (DVB), digital audio broadcasting (DAB), and in wireless applications, such as those that support 2G, 2.5G and 3G technologies. In this regard, the iterative multilayer approach may be utilized in GSM applications, for example.

Figure 9:
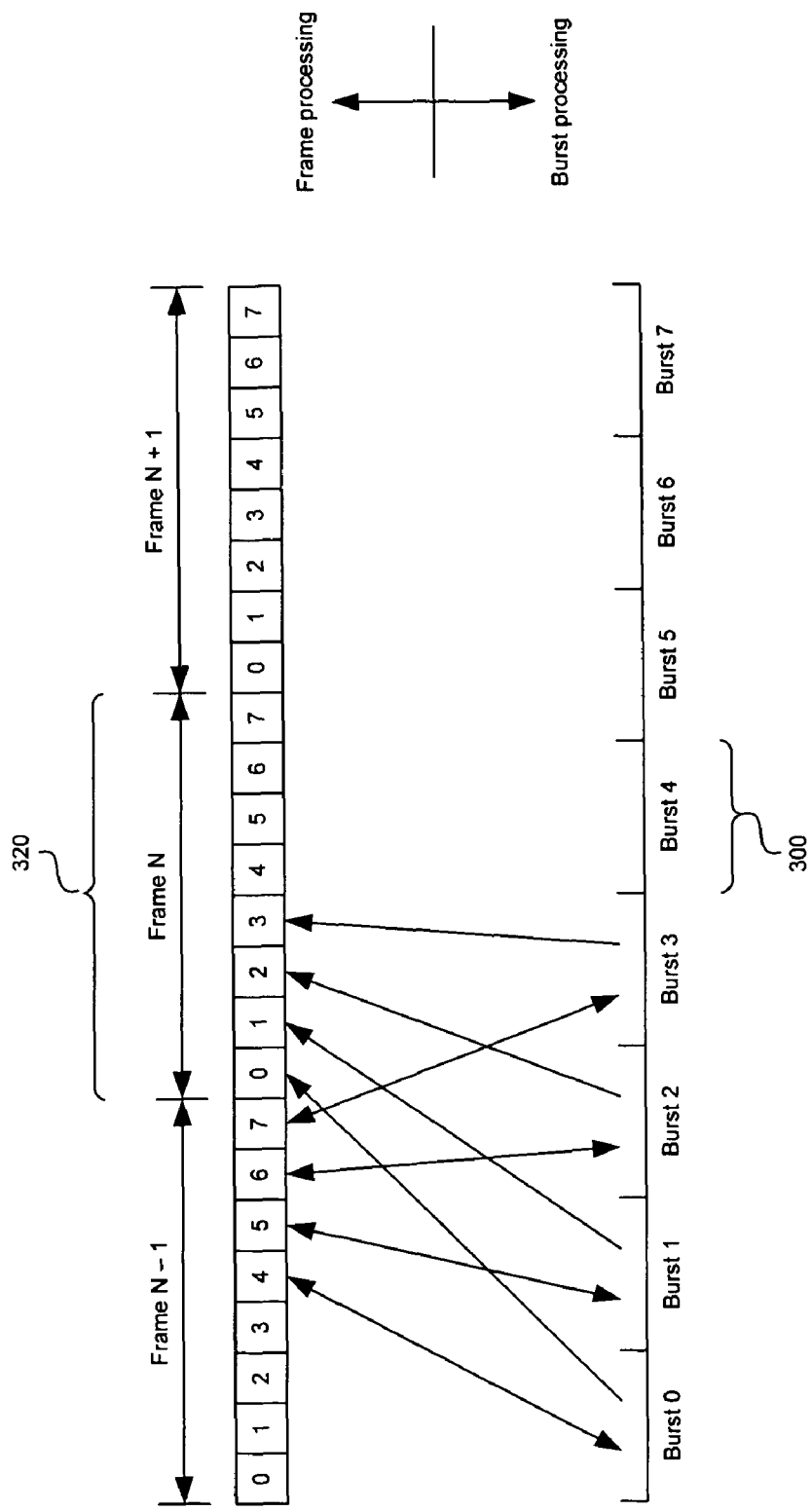
FIG. 9 is a diagram illustrating exemplary iterative frame and burst processes in 8-PSK GSM applications, in accordance with an embodiment of the invention.

FIG. 9 is a diagram illustrating exemplary iterative frame and burst processes in GSM applications, in accordance with an embodiment of the invention. Referring to FIG. 9, there is shown a series of at least one time slot burst 300 and a series of at least one frame 320 as illustrated in FIG. 3. The series of at least one time slot burst 300 may correspond to Burst 0 through Burst 7, while the series of at lest one frame 320 may correspond to Frame N−1 through Frame N+1. The time slot burst 300 may correspond to the structure of an EDGE burst mapped to a timeslot, comprising either 156 or 157 symbols, that utilizes 8-PSK modulation, for example.

There may be two types of iterative processes to consider: a causal iterative process and a non-causal iterative process. For the causal iterative process, Burst 0 through Burst 3 may each have 58 data symbols from the first data 304 portion of the time slot burst 300 that have been decoded during the frame processing of Frame N−1. Utilizing the decoded 58 data symbols in each of Burst 0 through Burst 3 and the 26 symbols in the midamble 306, the burst process may be recalculated or a second iteration of the burst process may occur. In this regard, the channel estimation operation of the burst process may be improved during a second iteration by utilizing the decoded data bits generated by the frame process. Moreover, the MLSE in the channel equalization operation of the burst process may consider that the decoded data bits are known with a higher probability than during the first iteration. In some instances, to reduce the complexity that may be introduced by a second iteration operation, the burst process may enable performing a second iteration on selected time slot bursts determined during the first iteration. In this regard, a particular time slot burst may be selected for a second iteration when it is associated with having a low carrier-to-interference (C/I) value, for example. Once the burst process improves the data, it may be further interleaved and processed by the frame process. The frame process my use a standard frame process or determine the best sequence based on, for example, redundancy.

For the non-causal iterative process, bits from Burst 0 through Burst 7 may be needed to recalculate the burst process for bit sequences that may be transferred to Frame N. Data from Frame N−1 and/or data from Frame N+1 may be utilized to calculate the burst process for bit sequences that may be transferred to Frame N. Utilizing the decoded 116 data symbols in each of Burst 0 through Burst 7 and the 26 symbols in the midamble 306, the burst process may be recalculated. As with the causal iterative process, a particular time slot burst may be selected for a second iteration when it is associated with having a low carrier-to-interference (C/I) value, for example.

Figure 10:
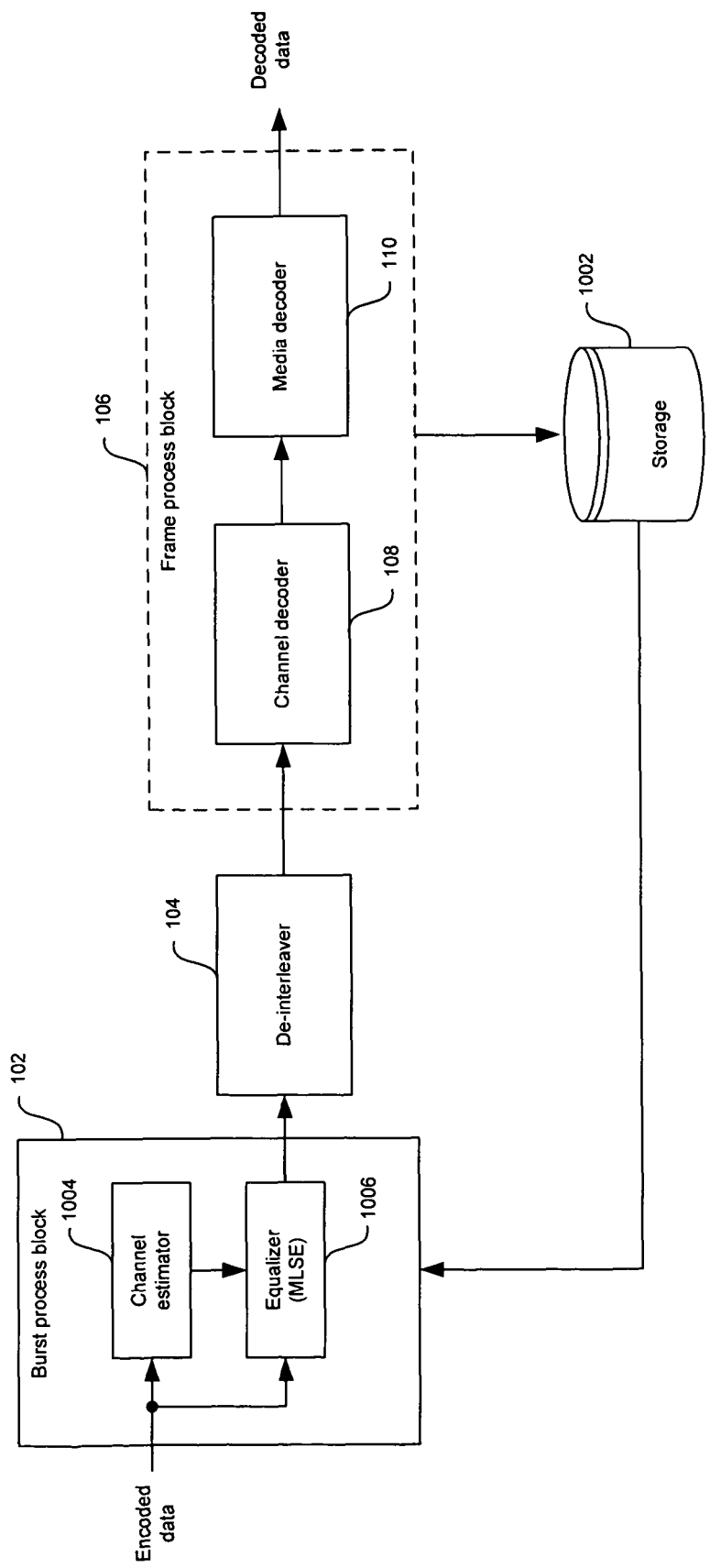
FIG. 10 is a block diagram illustrating exemplary iterative system, in accordance with an embodiment of the invention.

FIG. 10 is a block diagram illustrating an exemplary iterative system, in accordance with an embodiment of the invention. Referring to FIG. 10, there is shown the burst process block 102, the de-interleaver 104, the frame process block 106, the channel decoder 108, the media decoder 110, and a storage 1002. The burst process block 102 is shown to comprise a channel estimator 1004 and an equalizer 1006. The storage 1002 may comprise suitable logic, circuitry, and/or code that may enable storage of data associated with the frame process of a previously processed frame. The channel estimator 1004 may comprise suitable logic, circuitry, and/or code that may enable channel estimation operations during the burst process. The equalizer 1006 may comprise suitable logic, circuitry, and/or code that may enable MLSE channel equalization operations during the burst process.

In operation, data stored in the storage 1002 that resulted from a frame process operation may be transferred to the channel estimator 1004 and/or the equalizer 1006 for a second iteration of the burst process for the Frame N. In this regard, the data stored in the storage 1002 may comprise information regarding the time slot bursts in the burst process that may be utilized during the second iteration of the burst process for the Frame N.

When using the 58 data symbols and the 26 midamble symbols in the causal iterative process or when using 116 data symbols and the 26 midamble data symbols in the non-causal iterative process, hard decision values or soft decision values for the data symbols may be utilized during the second iteration of the burst process. In some instances, soft decision values may be preferred for a particular application.

The channel estimator 1004 in FIG. 10 may be adapted to perform a soft decision for the burst process. In instances when the equalizer 1006 in FIG. 10 is not adapted to handle the results from a previous iteration, a gradient search approach may be utilized for the second iteration in the burst process. In this regard, the first iteration may be performed in hardware and at least a portion of the second iteration may be performed in software, for example.

When determining the 8-PSK symbol burst in the burst process operation, for example, the baseband transmitted signal may be given by the following expression:

$$TX(t) = \sum_{n=0}^{N} D(n) \cdot \prod \left( \frac{t - n \cdot T_{SYM}}{T_{SYM}} \right), \quad (1)$$

where D(n) may correspond to the transmitted data symbol n, $T_{SYM}$ may correspond to the symbol duration, N may represent the data block length, and $$\prod(t) = \begin{cases} 1 & \text{if } 0 \le t \le 1 \\ 0 & \text{else} \end{cases}.$$

The transmitted data symbol may be a complex number that may represent any kind of constellation, such as an 8-PSK constellation, for example. Operations for the transformation of data symbols to data bits and data bits to data symbols may be defined as follows:

D(n)=Data To Symbol Look Up Table(B(L·n),B(L·n+1),B(L·n+2), . . . , B(L·n+L-1)), and

[B(L·n),B(L·n+1),B(L·n+2), . . . , B(L·n+L-1)]=Symbol To Data Look Up Table(D(n)), where B(n) may correspond to the transmitted data bit n and L may represent the number of bits per symbol.

After considering multi-path distortion and/or added noise, the signal received by the burst processor block 102 in the receiver 100 in FIG. 1A may be expressed as follows:

$$RX(t) = \sum_{m=0}^{M-1} A_m \cdot TX(t - T_m) + \text{Noise}(t), \quad (2)$$

where M may represent the multipath length, $A_m$ may correspond to the amplitude associated with the path m, $T_m$ may represent the delay associated with the path m, and Noise(t) may represent the additive noise. The sampled form of the received signal in Equation (2) may be given by the following expression:

$$RX(n) = \frac{1}{T_{SYM}} \cdot \int_0^{T_{SYM}} RX(t - (n-1) \cdot T_{SYM}) \cdot dt, \quad (3)$$

where $T_{SYM}$ may correspond to the symbol duration. After combining Equations (1) and (2) into Equation (3) and considering that the ratio $\tau_m=(T_m/T_{SYM})$ corresponds to an integer number, the relationship in Equation (3) may be given by the following expression:

where $$RX(n) = \sum_{m=0}^{M-1} A_m \cdot D(n - \tau_m) + \text{Noise}(n), \quad (4)$$

$$\text{Noise}(n) = \frac{1}{T_{SYM}} \cdot \int_0^{T_{SYM}} \text{Noise}(t - (n-1) \cdot T_{SYM}) \cdot dt.$$

Because the transmitted data block has a finite length N, the received samples block may also have a finite interval. When $\tau_0=0$ and the multi-path diversity is equal to $\tau_{M-1}$, then the interval of the received samples block may be $0 \le n < N+\tau_{M-1}$, for example. In this exemplary embodiment of the invention, the received samples evaluation may be expressed in matrix form as follows:

$$RX = A \cdot D + \text{Noise}, \quad (5)$$

where D is a transmitted data vector of length N, RX is a received samples vector with length $N+\tau_{M-1}$, Noise is a received noise vector with length $N+\tau_{M-1}$, and A is a channel matrix with dimensions $N \times N+\tau_{M-1}$ and coefficients $$A(m, n) = \begin{cases} A_{m-n} & 0 \le (m-n) < M \\ 0 & \text{else} \end{cases}. \quad (6)$$

Various approaches may be utilized during the burst process for determining transmitted data estimations based on the received samples evaluation described in Equation (4) and Equation (5). Exemplary approaches may comprise a match filter method and a maximum likelihood method.

The match filter approach for determining transmitted data estimations may be utilized when considering optimization from the perspective of additive noise. The matched filter evaluation may be given by the following expression:

or in matrix form, $$\hat{D}(n) = \sum_{m=0}^{M-1} conj(A_m) \cdot RX(n - \tau_m), \quad (7)$$

$$\hat{D} = A^T \cdot RX = (A^T \cdot A) \cdot D + A^T \cdot \text{Noise}, \quad (8)$$

where $\hat{D}$ may represent the transmitted symbol estimation vectors and the square matrix $A^T \cdot A$ may be an autocorrelation matrix. In this regard, straight transformations from data symbols to data bits and from data bits to data symbols may occur. The diagonal element of the autocorrelation matrix represents symbol energy and may be expressed by:

$$E_{SYM} = \sum_{m=0}^{M-1} |A_m|^2. \quad (9)$$

The non diagonal elements of the autocorrelation matrix may represent inter-symbol interference (ISI). The non-diagonal portion of the autocorrelation matrix may be an ISI matrix and may be described by the following expression:

$$\text{ISI} = A^T \cdot A - E_{SYM} \cdot I. \quad (10)$$

The matrix form representation of the transmitted symbol estimation vectors in Equation (8) may also be expressed as follows:

$$\hat{D} = E_{SYM} \cdot D + \text{ISI} \cdot D + A^T \cdot \text{Noise}. \quad (11)$$

From Equation (11), the match filter output may comprise transmitted symbols with amplitude equal to $E_{SYM}$, inter-symbol interference (ISO, and additive noise. When the ISI component is small, the match filter approach may be very effective. Otherwise, alternative solutions may be needed to more effectively determine the transmitted data estimations based on the received sample evaluations.

The maximum likelihood solution for the estimation of the transmitted symbol vector may correspond to the estimation of the minimum distance between the received samples vector and the received samples estimation, for example. This distance may be given by the following expression:

$$\text{Dist} = \sum_{n=0}^{N-1+\tau_{M-1}} \left| RX(n) - \sum_{m=0}^{M-1} A_m \cdot \hat{D}(n - \tau_m) \right|^2, \quad (12)$$

or in matrix form $$\text{Dist} = [RX - A \cdot \hat{D}]^T \cdot [RX - A \cdot \hat{D}]. \quad (13)$$

Several approaches may be utilized to evaluate the expression in Equation (13). For example, all possible combination of symbols vector may be checked. However, for large vector lengths the complexity of this approach may be too high. In another example, a Viterbi equalizer approach may be utilized that may provide reduced complexity in its implementation. In another example, a gradient search equalizer approach may be utilized that may provide reduced complexity from that of the Viterbi equalizer approach.

In the gradient search equalizer approach, the gradient of distance between received samples vector and received samples estimation in Equation (13) may be given by the following expression:

$$G = \frac{\partial \text{Dist}}{\partial \hat{D}} = 2 \cdot A^T \cdot [RX - A \cdot \hat{D}]. \quad (14)$$

In Equation (14), the operation of multiplication of received samples vector with the transpose channel matrix $A^T$ may be referred to as match filtering while the multiplication of the estimated symbol vector with the channel matrix may be referred to as received samples estimation and may be given by the following expression:

$$\hat{RX} = A \cdot \hat{D} \text{ or } \hat{RX}(n) = \sum_{m=0}^{M-1} A_m \cdot \hat{D}(n - \tau_m). \quad (15)$$

In this regard, the gradient of the distance in Equation (14) may also be given by the following expression:

$$G = 2 \cdot \text{MatchFilter}(RX - \text{SamplesEstimator}(\hat{D})). \quad (16)$$

For any estimated symbol vector it may be possible to find or determine the gradient, that is, a relative increment to the estimated symbol vector such that new estimated symbol vector more closely achieve the minimum distance point, that is, the maximum likelihood point described in Equations (12) and (13). By utilizing a gradient search approach, an iterative convergence to a minimum distance point or maximum likelihood point may be achieved. An exemplary expression for convergence utilizing a gradient search equalization control may be the following:

$$\hat{D}_{NEW} = \hat{D}_{OLD} + \mu \cdot \text{sign}(E_{SYM} \cdot \hat{D}_{OLD} + 0.5 \cdot G), \quad (17)$$

where $\mu$ may represent a convergence coefficient and G is the gradient of the distance as given by Equation (16).

Figure 11A:
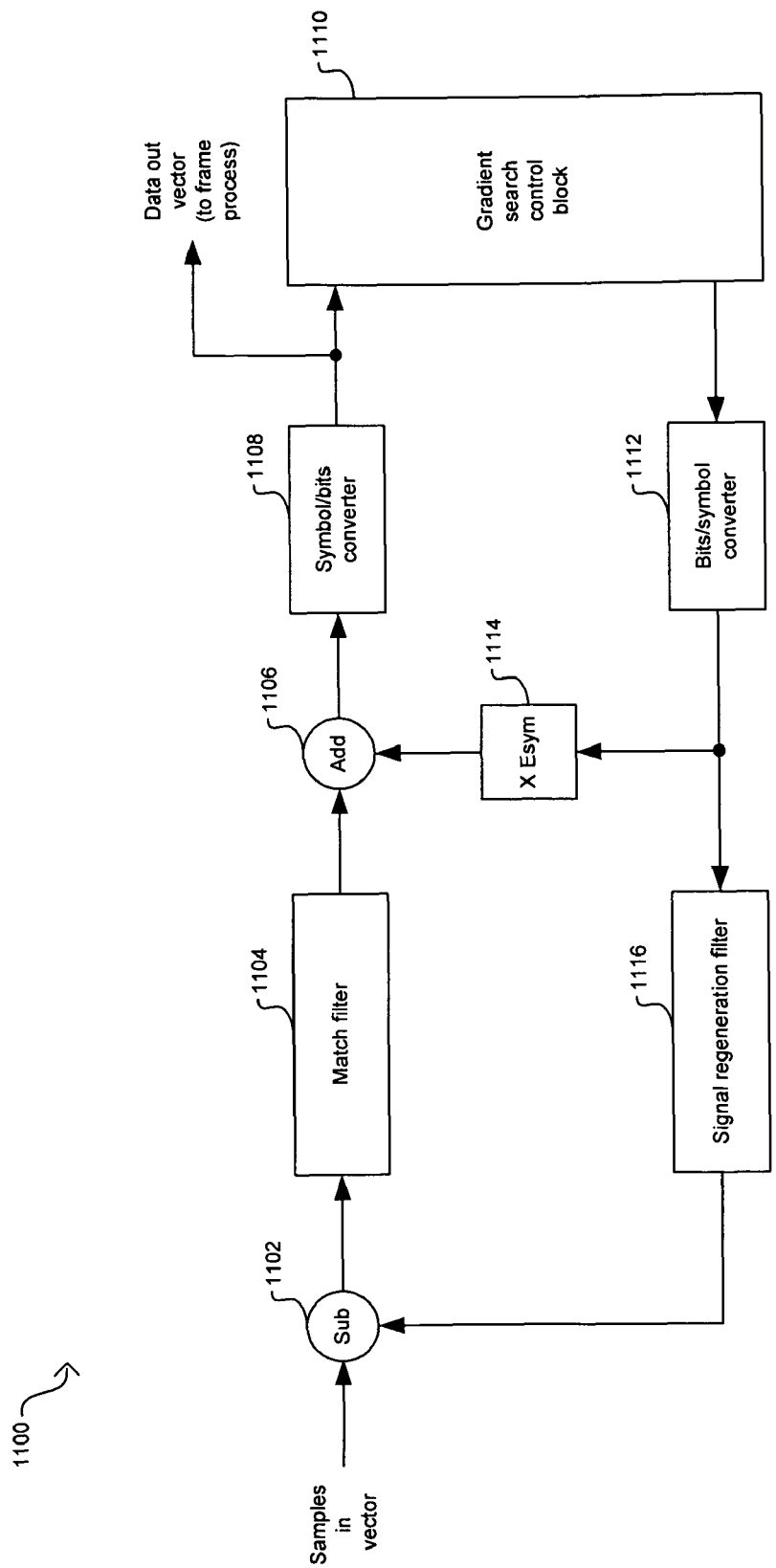
FIG. 11A is a block diagram illustrating an exemplary gradient search equalizer in a burst process, in accordance with an embodiment of the invention.

FIG. 11A is a block diagram illustrating an exemplary gradient search equalizer in a burst process, in accordance with an embodiment of the invention. Referring to FIG. 11A, there is shown a gradient search equalizer 1100 that may comprise a substractor (sub) 1102, a match filter 1104, an adder (add) 1106, a symbols-to-bits converter 1108, a gradient search control block 1110, a bits-to-symbol converter 1112, an energy multiplication block (Esym) 1114, and a signal regeneration filter 1116. The gradient search equalizer 1100 may be implemented utilizing hardware, software, or a combination of hardware and software. The gradient search equalizer 1100 may be utilized for burst processing operations in a multilayer processing system, for example. In this regard, the gradient search equalizer 1100 may be utilized during a burst process operation in an iterative multilayer processing system that may utilize redundancy decoding during frame process operations.

The subtractor 1102 may comprise suitable logic, circuitry, and/or code that may enable subtraction of regenerated signal from the signal regeneration filter 1116 from the received samples vector. The match filter 1104 may comprise suitable logic, circuitry, and/or code that may enable match filtering as described in Equation (14) through Equation (16). The adder 1106 may comprise suitable logic, circuitry, and/or code that may enable addition of the results from the match filter 1104 and the Esym 1114. The symbol-to-bits converter 1108 may comprise suitable logic, circuitry, and/or code that may enable conversion of symbol sequences to bit sequences for processing by the gradient search control block 1110 and/or for transfer to the frame process operation. For 8-PSK, for example, a symbol may be converted into a three-bit sequence. The bits-to-symbol converter 1112 may comprise suitable logic, circuitry, and/or code that may enable conversion of bit sequences to symbol sequences for processing by Esym 1114 and the signal regeneration filter 1116. For 8-PSK, for example, a three-bit sequence may be converted into a symbol.

The Esym 1114 may comprise suitable logic, circuitry, and/or code that may enable multiplication of the symbols from the bits-to-symbol converter 1112 by their corresponding energy as described in Equation (9). The signal regeneration filter 1116 may comprise suitable logic, circuitry, and/or code that may enable regeneration of the received signal based on the received samples estimation provided by the gradient search equalization operation. The gradient search control block 1110 may comprise suitable logic, circuitry, and/or code that may enable determination of the gradient of the distance in Equation (14) and utilizing the gradient to determine a new symbol estimation vectors for convergence to a minimum distance point or maximum likelihood point as described in Equation (17). In some instances, the convergence coefficient may be programmable.

In operation, a previously regenerated signal may be subtracted from the received symbol vector and the result may be match filtered by the match filter 1104. A factor corresponding to the energy of each symbol may be added to the result of the match filter in the adder 1106. The resulting symbols from the adder 1106 may be converted into bit sequences that may be transferred or communicated to the gradient search control block 1110. When convergence to a minimum distance point or maximum likelihood point has occurred, the converted bit sequences may be transferred or communicated to a frame process operation.

When convergence has not occurred, the bit sequence may be utilized by the gradient search control block 1110 to determine the gradient and a new estimated symbol vector. From these results the gradient search control block 1110 may determine whether convergence has occurred during the current iteration and whether further iterations may be necessary. The bit sequence resulting from the operations of the gradient search control block 1110 may be converted into estimated symbols by the bits-to-symbol converter 1112. When subsequent iterations are necessary for convergence of the gradient search equalization operation, the signal regeneration filter 1116 and the Esym 1114 may utilize the converted estimated symbols from the bits-to-symbol converter 1112.

In instances where additional information exists about the probability of the received symbols, it may be possible to start the gradient search equalization operation from a point that may be closer to the minimum distance, that is, the maximum likelihood. Such additional information may be sufficient to reduce the number of convergence steps necessary to achieve a minimum distance point or maximum likelihood point. The additional information may be received from a reduced complexity Viterbi equalizer, where the reduced complexity corresponds to a reduced channel impulse response, from interleaved error correction, and/from source properties, for example. In some instances, the number of iterations that may be needed for convergence in a gradient search equalizer with additional information may be reduced to a single final iteration.

Figure 11B:
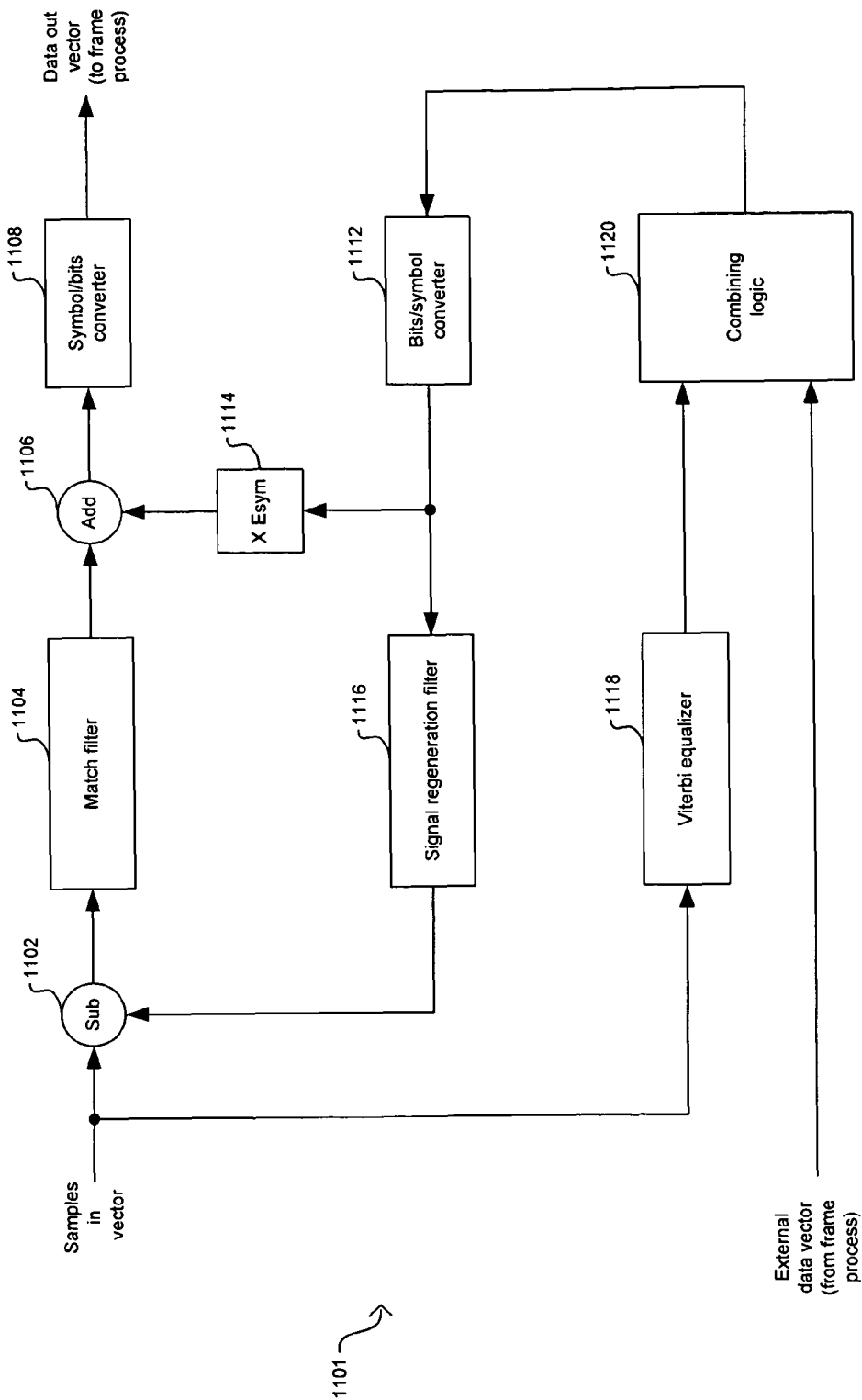
FIG. 11B is a block diagram illustrating an exemplary final iteration gradient search equalizer, in accordance with an embodiment of the invention.

FIG. 11B is a block diagram illustrating an exemplary final iteration gradient search equalizer, in accordance with an embodiment of the invention. Referring to FIG. 11B, there is shown a gradient search equalizer 1101 that may comprise the substractor (sub) 1102, the match filter 1104, the adder (add) 1106, the symbols-to-bits converter 1108, the bits-to-symbol converter 1112, the energy multiplication block (Esym) 1114, and the signal regeneration filter 1116 described in FIG. 11A. The gradient search equalizer 1101 may also comprise a Viterbi equalizer 1118, and a combining logic 11120. The gradient search equalizer 1101 may be implemented utilizing hardware, software, or a combination of hardware and software. The gradient search equalizer 1101 may be utilized for burst processing operations in a multilayer processing system, for example. In this regard, the gradient search equalizer 1100 may be utilized during a burst process operation in an iterative multilayer processing system that may utilize redundancy decoding during frame process operations.

The Viterbi equalizer 1118 may comprise suitable logic, circuitry, and/or code that may enable equalization of the received samples during a burst process operation. The combining logic 1120 may comprise suitable logic, circuitry, and/or code that may enable weighing the results of the Viterbi equalizer 1118 and additional external data vector from the frame process to generate a bit sequence that corresponds to an estimated symbol vector. In instances where external data from the frame process is available, the burst process operation utilizing the gradient search equalizer 1101 may be an iterative burst process, for example.

In operation, the Viterbi equalizer 1118 may equalize the received samples. The results from the Viterbi equalizer 1118 and external data vector information from the frame process may be combined in the combining logic 1120. The combining logic 1120 may provide a heavier weight to the results from the frame process, for example. In this regard, the weight given to the results from the Viterbi equalizer 1118 and the external data vector information may be programmable. The bit sequence corresponding to the estimated symbol vector generated by the combining logic 1120 may be converted to a symbol sequence by the bits-to-symbol converter 1112.

The signal regeneration filter 1116 and the Esym 1114 may utilize the symbol sequence generated by the bits-to-symbol converter 1112 to perform a single iteration of the gradient search operation. In this regard, the regenerated signal from the signal regeneration filter 1116 may be subtracted from the received symbol vector and the result may be match filtered by the match filter 1104. The factor corresponding to the energy of each symbol generated by the Esym 1114 may be added to the result of the match filter in the adder 1106. The resulting symbols from the adder 1106 may be converted into bit sequences by the symbol-to-bits converter 1108 and may be transferred or communicated to the frame process.

The approach described herein may result in fewer decoding bit errors than may occur from the use of a standard Viterbi algorithm. In this regard, the use of a multilayer process or an iterative multilayer process that utilizes redundancy and physical constraints may be efficiently implemented in the design of optimized receivers for decoding interdependent signals, such as convolutional encoded data, for example in GSM applications that utilize 8-PSK modulation.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
performing by one or more processors and/or circuits:
processing a received 8-PSK modulated symbol sequence in a burst process utilizing a gradient search equalization operation, said processing comprising:
computing a distance metric value during said gradient search equalization operation wherein said distance metric value is based on at least a portion of said received 8-PSK modulated symbol sequence, a computed channel estimate matrix and a transmitted symbol estimation vector;
computing a gradient distance value based on a change in said computed distance metric value in response to a change in said transmitted symbol estimation vector;
computing an updated transmitted symbol estimation vector based on a current transmitted symbol estimation vector and said computed gradient distance value;
generating a redundancy-based decoded output bit sequence by a frame process based on results from said burst process;
feeding back said generated redundancy-based decoded output bit sequence for processing by a subsequent burst process utilizing said gradient search equalization operation; and
generating a subsequent redundancy-based decoded output bit sequence by a subsequent frame process based on results from said subsequent burst process.

2. The method according to claim 1, comprising converting said received symbol sequence to a bit sequence.

3. The method according to claim 1, comprising generating said burst process results based on at least one iterative step of said gradient search equalization operation.

4. The method according to claim 1, comprising converting said burst process results to a symbol sequence.

5. The method according to claim 1, comprising converting said results from said subsequent burst process to a bit sequence.

6. The method according to claim 1, comprising combining said fed-back generated redundancy-based decoded output bit sequence with results from a Viterbi equalization operation within said subsequent burst process.

7. The method according to claim 6, comprising converting said combined fed-back generated redundancy-based decoded output bit sequence with results from said Viterbi equalization operation to a symbol sequence.

8. A non-transitory computer readable medium having stored thereon, a computer program having at least one code section for signal processing, the at least one code section being executable by a computer for causing the computer to perform steps comprising:
processing a received 8-PSK modulated symbol sequence in a burst process utilizing a gradient search equalization operation, said processing comprising:
computing a distance metric value during said gradient search equalization operation wherein said distance metric value is based on at least a portion of said received 8-PSK modulated symbol sequence, a computed channel estimate matrix and a transmitted symbol estimation vector;
computing a gradient distance value based on a change in said computed distance metric value in response to a change in said transmitted symbol estimation vector;
computing an updated transmitted symbol estimation vector based on a current transmitted symbol estimation vector and said computed gradient distance value;
generating a redundancy-based decoded output bit sequence by a frame process based on results from said burst process;
feeding back said generated redundancy-based decoded output bit sequence for processing by a subsequent burst process utilizing said gradient search equalization operation; and
generating a subsequent redundancy-based decoded output bit sequence by a subsequent frame process based on results from said subsequent burst process.

9. The non-transitory computer readable medium according to claim 8, wherein said at least one code section comprises code for converting said received symbol sequence to a bit sequence.

10. The non-transitory computer readable medium according to claim 8, wherein said at least one code section comprises code for generating said burst process results based on at least one iterative step of said gradient search equalization operation.

11. The non-transitory computer readable medium according to claim 8, wherein said at least one code section comprises code for converting said burst process results to a symbol sequence.

12. The non-transitory computer readable medium according to claim 8, wherein said at least one code section comprises code for converting said results from said subsequent burst process to a bit sequence.

13. The non-transitory computer readable medium according to claim 8, wherein said at least one code section comprises code for combining said fed-back generated redundancy-based decoded output bit sequence with results from a Viterbi equalization operation within said subsequent burst process.

14. The non-transitory computer readable medium according to claim 13, wherein said at least one code section comprises code for converting said combined fed-back generated redundancy-based decoded output bit sequence with results from said Viterbi equalization operation to a symbol sequence.

15. A system for signal processing, the system comprising:
a burst processor and a frame processor;
said burst processor is operable to process a received 8-PSK modulated symbol sequence by utilizing a gradient search equalization operation;
said burst processor is operable to compute a distance metric value during said gradient search equalization operation wherein said distance metric value is based on at least a portion of said received 8-PSK modulated symbol sequence, a computed channel estimate matrix and a transmitted symbol estimation vector;
said burst processor is operable to compute a gradient distance value based on a change in said computed distance metric value in response to a change in said transmitted symbol estimation vector;

said burst processor is operable to compute an updated transmitted symbol estimation vector based on a current transmitted symbol estimation vector and said computed gradient distance value;

said frame processor is operable to generate a redundancy-based decoded output bit sequence based on burst process results from said burst processor;

said frame processor is operable to feed back said generated redundancy-based decoded output bit sequence for processing by said burst processor in a subsequent burst process utilizing said gradient search equalization operation; and said frame processor is operable to generate a subsequent redundancy-based decoded output bit sequence by a subsequent frame process based on results from said subsequent burst process by said burst processor.

16. The system according to claim 15, wherein said burst processor is operable to convert said received symbol sequence to a bit sequence.

17. The system according to claim 15, wherein said burst processor is operable to generate said burst process results based on at least one iterative step of said gradient search equalization operation.

18. The system according to claim 15, wherein said burst processor is operable to convert said burst process results to a symbol sequence.

19. The system according to claim 15, wherein said burst processor is operable to convert said results from said subsequent burst process to a bit sequence.

20. The system according to claim 15, wherein said burst processor is operable to combine said fed-back generated redundancy-based decoded output bit sequence with results from a Viterbi equalization operation within said subsequent burst process.

21. The system according to claim 20, wherein said burst processor is operable to convert said combined fed-back generated redundancy-based decoded output bit sequence with results from said Viterbi equalization operation to a symbol sequence.

* * * * *